(12) United States Patent
Djavanroodi

(10) Patent No.: US 10,773,286 B1
(45) Date of Patent: Sep. 15, 2020

(54) EQUAL CHANNEL ANGULAR PRESSING OF MULTI SIZE COPPER WIRE

(71) Applicant: Prince Mohammad Bin Fahd University, Dhahran (SA)

(72) Inventor: Faramarz Djavanroodi, London (GB)

(73) Assignee: Prince Mohammad Bin Fahd University, Dhahran (SA)

( * ) Notice: Subject to any disclaimer, the term of this patent is extended or adjusted under 35 U.S.C. 154(b) by 0 days.

(21) Appl. No.: 16/774,555

(22) Filed: Jan. 28, 2020

(51) Int. Cl.
| | | |
|---|---|---|
| B21C 23/00 | (2006.01) | |
| B21C 37/04 | (2006.01) | |
| B21C 25/02 | (2006.01) | |
| C22F 1/08 | (2006.01) | |

(52) U.S. Cl.
CPC .......... B21C 23/001 (2013.01); B21C 23/002 (2013.01); B21C 37/047 (2013.01); *B21C 25/025* (2013.01); *B22F 2998/10* (2013.01); *C22F 1/08* (2013.01)

(58) Field of Classification Search
CPC ... B21C 37/042; B21C 37/045; B21C 37/047; B21C 23/001; B21C 23/002; B21F 1/004; B21F 9/005; B21F 9/007
See application file for complete search history.

(56) References Cited

U.S. PATENT DOCUMENTS

| | | | | |
|---|---|---|---|---|
| 8,626,254 | B2 * | 1/2014 | Somerkoski | ........ H01L 39/2409 505/232 |
| 2008/0213589 | A1* | 9/2008 | Hanazaki | .............. B21C 37/042 428/392 |

FOREIGN PATENT DOCUMENTS

| | | | | |
|---|---|---|---|---|
| CN | 1131588 | A | 9/1996 | |
| CN | 108296297 | A | 7/2018 | |
| EP | 2436808 | A1 * | 4/2012 | ............. D07B 1/147 |
| JP | 2003-245712 | A | 9/2003 | |
| JP | 2006-224135 | A | 8/2006 | |

OTHER PUBLICATIONS

F. Djavanroodi, et al., "Equal Channel Angular Pressing of Tubular Samples", Acta Metallurgica Sinica (English Letters), vol. 26, No. 5, Oct. 2013, pp. 574-580.
G. Purcek, et al., "Microstructure and mechanical behavior of UFG copper processed by ECAP following different processing regimes", Philosophical Magazine, vol. 92, No. 6, Feb. 21, 2012, pp. 690-704.
(Continued)

*Primary Examiner* — Christopher J Besler
(74) *Attorney, Agent, or Firm* — Oblon, McClelland, Maier & Neustadt, L.L.P.

(57) ABSTRACT

A process to fabricate ultra-fine grain metal wire, comprising: inserting a plurality of metal strands into a flexible elastic polyurethane sheath having an accommodating slot for each of the strands of metal to form a sheathed strand assembly; equal channel angular pressing (ECAP pressing) the sheathed strand assembly through an ECAP die having a plurality of die channels corresponding to the plurality of metal strands. The process is designed to improve electric conductance and mechanical properties of elongated metal parts and is especially applicable to optimize the conductance and tensile strength of copper cables, wires, strings, and rods.

10 Claims, 6 Drawing Sheets

(56) References Cited

OTHER PUBLICATIONS

M. Borhani, et al., "Rubber pad-constrained groove pressing process: Experimental and finite element investigation", Materials Science and Engineering A, vol. 546, Jun. 2012, pp. 1-7.

V. I. Betekhtin, et al., "Influence of the Number of Passes under Equal-Channel Angular Pressing on the Elastic-Plastic Properties, Durability, and Defect Structure of the Al + 0.2 wt. % Sc Alloy", Defects and Impurity Centers, Dislocations, and Physics of Strength, Physics of the Solid State, vol. 52, No. 8, Aug. 2010, pp. 1629-1636 (Abstract only).

F. Djavanroodi, et al., "Equal channel angular pressing of copper wire", Proc. Institution of Mechanical Engineers Part B: Journal of Engineering Manufacture, vol. 228, No. 10, 2014, pp. 1273-1279.

Muhammad Waqar Ashraf, et al., "Adsorption Studies of Textile Dye (Chrysoidine) from Aqueous Solutions Using Activated Sawdust", Hindawi International Journal of Chemical Engineering, Article ID: 9728156, 2019, 8 pages.

* cited by examiner standard     back slant     front slant

Cross-section of an ECAP channel

EQUAL CHANNEL ANGULAR PRESSING OF MULTI SIZE COPPER WIRE

BACKGROUND OF THE INVENTION

Technical Field

The present disclosure relates to a method of manufacturing metal wire with simultaneously enhanced mechanical properties and improved electro-conductivity by applying Equal Channel Angular Pressing (ECAP).

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Highly conductive and mechanically strong metal wires and cables are ubiquitous and indispensable components of technological solutions standing at the foundation of the industrial world such as: conductors in electric power transmission (See US20180247736A1) and heating (See US20190148034A1), wiring of electric motors, batteries, supercapacitors (See DE102013019442A1), connectors and wiring providing energy to electrolytic baths (See CN201319275Y), providing power for transportation (See CN102386590A, CN102815309B), serving the electric grid (See DK2443663T3, CN102859827A), forming an essential component of power transformers (See KR101025837B1, CN104917354A, CN205583687U) and telephone and data cables (See US20180096753A1), Less fundamental, but still important applications are found in fishery netting industry (See US20190211578A1), engineered springs (See US20190085927A1), wire-cloth making and wire rope spinning (See U.S. Pat. No. 9,872, 383B1). Other applications exist for fencing (See U.S. Pat. No. 2,674,737A), for suspension bridges (See U.S. Pat. No. 2,429,332A), cages (See U.S. Pat. No. 6,626,970), stringed musical instruments (See US20180087125A1) and scientific or medical devices (See U.S. Pat. No. 9,861,596). Carbon and stainless spring steel wire have applications in engineered springs for automotive or industrial manufactured parts/components (See US20190101176A1). Pin and hairpin making (See U.S. Pat. No. 6,171,042); the needle and fish-hook industries (See US20060185221A1); nail, peg, and rivet making; and carding machinery consume large amounts of wire as feedstock, and so do diverse deposition techniques (See N. I. S. Hussein, J. Segal, D. G. McCartney, and I. R. Pashby, 2008. *Materials Science and Engineering: A*, 2008, 497(1-2), pp. 260-269). The ductile deformable metals suitable for wire manufacturing comprise platinum, silver, iron, copper, aluminum, gold, brass and bronze. Perhaps exceptions are tungsten filaments for electric bulbs.

Copper wire and cables possess unique properties that have ensured prominence of this material in electro-mechanical applications since the beginning of the 19-th century (See: A. Ramirez, *American Scientist*. 2015, 103(3), 180-4). Copper wire is used at the initial stages of power generation, in power transmission, power distribution, telecommunications, electronics circuitry, in diverse types of electrical and electronic devices, in electrodes and electrical contacts as electrical wiring in buildings.

A set of electrical, metallurgical and mechanical properties, as well as relatively economical pricing range, make copper the dominant material in the applications above. Copper has the highest electrical conductivity rating of all non-precious metals: the electrical resistivity of copper=16.78 $n\Omega \cdot m$ at 20° C. Silver is the only metal with a higher electrical conductivity than copper. The electrical conductivity of silver is 106% of that of annealed copper on the IACS scale, and the electrical resistivity of silver=15.9 $n\Omega \cdot m$ at 20° C. (See R, Weast, *CRC, Handbook of Chemistry and Physics*. Boca Raton, Fla.: Chemical Rubber Company Publishing, 1984, ISBN 0-8493-0464-4, pp E110).

However, silver is a more expensive material that is inferior to copper in mechanical properties. Copper's higher tensile strength (200-250 N/mm2 annealed) compared to aluminum (100 N/mm2 for typical conductor alloys) is comparably advantageous in construction and electro-technical applications. Copper's high strength prevents diverse forms of mechanical failure, facilitating uninterrupted service. Copper also has high ductility, just below gold and silver and therefore is easy to extend to diameters with very close tolerances. This high ductility is accompanied by mechanical strength and high fatigue resistance to bending, twisting or pulling without breakdown or more gradual deterioration. Under the alternating load conditions, copper demonstrates minimal creeping behavior. Being more electropositive in most of galvanic pairs, copper tends to be less prone to electrochemical and direct oxidative corrosion. An additional benefit of this stability is that many other metals can serve as sacrificial protective cathodes for copper.

At high currents and high extent of heat production, as well as in any other elevated temperature conditions, metal parts should not expand or experience an unacceptable level of deformation. Copper has a low coefficient of thermal expansion for an electro-conducting material. This property makes copper more reliable over a broad range of temperatures. Low thermal expansion is advantageously coupled with high thermal conductivity allowing effective dissipation of the internal Ohmic heat, inductive heat or externally applied heat, contributing to the stability of the main function of the wiring. Another advantageous property is solderability with diverse forms of fluxes and heat sources, producing reliable and mechanically strong connections not contributing to excess resistance. (Al, Zn, Fe) can be used deliberately as sacrificial corrosion protectors for copper installations (See D. E. Tyler and W. T. Black, *ASM International, Metals Handbook, Tenth Edition.*, 1990, 2, pp. 216-240; M. Li, S. J. Zinkle, *Comprehensive Nuclear Materials*. 2012:667-90; J. R, Davis, *ASM Specialty Handbook: Copper and Copper Alloys*, 2001, ASM International, Metals Park, Ohio, USA, pp. 1-600. 2008). Copper wire and cables are comparatively easy to install (See: "*Electrical: Building Wire—Copper, The Best Buy*". Copper.org. 2010 Aug. 2025; *Copper Development Association*, retrieved Oct. 4 2019).

Pure copper is significantly more conductive than bronze, brass, and other alloys ($1.6 \times 10^{-7}$ Siemens/m for pure copper, $3.6 \times 10^{-8}$ Siemens/m for phosphor bronze, $5.3 \times 10^{-8}$ Siemens/m for low brass (See data of *Eddy Current Technology Incorporated*). For most electrotechnical and electrochemical applications, such differences in conductivity mean that only pure copper is of interest as a cable/wire material. High ohmic losses in bronze and brass will be further amplified by inferior heat conductance leading to greater temperature increases at the same currents and a further increase in ohmic resistance by this positive feedback.

The decreased conductance of copper alloys as compared to chemically pure copper is a result of an inverse relationship between structural heterogeneity and conductivity (both thermal and electric) which is observed in all conductive materials due to a fundamental nature of this phenomenon. Specifically, electronic conductance takes place due to the presence of semi-populated conjugated electronic orbitals (Fermi levels in metals or p-orbitals in polyaromatic organic polymers). A diffusional leap by an electron from one local energy minimum to another requires a quantity of activation energy which is released in the next environment and if the environments are completely uniform, the released amount equals the quantity needed for overcoming the next activation barrier. In such cases, diffusional leaps by a conductivity carrier follow in a rapid succession, by Newton's Cradle analogy, wherein mechanical spheres of equal mass conduct energy without losses, while inequality of masses produces rapid dissipation (See D. R. Lovett, K. M. Moulding, S. Anketell-Jones, *European Journal of Physics*. 1988, 9 (4), 323). In structurally heterogeneous materials, the activation energies do not balance between the energy minimum positions and when the activation energy received in the downstream environment is lesser than the required for a diffusional leap of a conductivity carrier, a delay ensues. The decrease of conductance is proportional to the duration of these nonuniformity-induced delays in the movement of the carrier population. The sources of the structural heterogeneity are impurities, micro defects, crystal anisotropy, broad distribution of crystal dimensions (See M. V. Novikov, A. L. Maistrenko, V. I. Kushch, S. A. Ivanov, *Materials Science*, 2006, 42(1), 113-20; Z. Duriagina, K. Dvorianyn, S. Shvachko, E. Pleshakov, T. Tepla, *In Litteris et Artibus*, 2015, Lviv Polytechnic Publishing House). The micro defects are also responsible for the initiation of structural failure in materials (See J. Pokluda and P. Šandera, *Springer Science & Business Media*, 2010 May 27).

There is a need to refine and post-process the internal structure of a metal wire to simultaneously maximize tensile strength and electric conductivity. This need is adequately addressed by Equal Channel Angular Pressing method (ECAP) (see R. Z. Valiev and T. G. Langdon, *Reviews on Advanced Materials Science*, 2006, 13(1), 15-26).

The detailed description of ECAP process is provided in F. Al-Mufadi and F. Javanroodi, *Arab J Sci Eng*, 2015, 40, 2785-279 incorporated herein by reference in its entirety and disclosing Equal-Channel Angular Pressing of thin-walled copper tubes. FIG. 2 of the publication shows the setting of ECAP process. A die channel of elongated cylindrical form is bent, forming an angle in the range 90-150°, 90° being the most typical. The die channel is loaded with the metal part to process which is supported by a mandrel if the workpiece is hollow or does not otherwise occupying the entire channel volume. The mandrel material is typically sand, oil, rubber, wood, coal or metal. A pusher (punch) of the same cross-section as the channel is driven by a hydraulic press into the channel, moving the processed part along into and through the bent section. It is in this angled part that most of the plastic deformation takes place under strong shearing forces produced by pressure. Larger crystallites are homogenized, while nano-crystallites survive and eventually all reduce to the nanometer-scale after repeated process cycles. The crystals become monodisperse, isotropic and oriented in the same direction. The micro defects are healed by both plastic deformation and rising temperature due to friction, causing annealing and re-orientation of the deformed crystals at higher temperatures. Under the conditions of high pressure, filling of the microcavities and micro-cracks is favorable thermodynamically as reducing the hydrostatic head.

Al-Mufadi et al. disclose a non-trivial and poorly reproducible role of the supporting material in ECAP, since grease was not successful support for a hollow item, leading to collapse, while using sand was time-consuming. The role of the support becomes even more prominent considering fragile thin-walled tubes or attempts to re-work a wire. The forces of reaction in the turning angle of the die ECAP channel can collapse hollow items if these forces are not balanced by hydrostatic-like pressure exerted from the opposite side (from the inside of the hollow item) by deformed and compressed support. The complexity of forces acting in this system and the absence of a precise comprehensive theory makes an outcome empirical and non-trivial in each case. While showing dramatic changes in the copper properties in a tubular part Al-Mufadi does not disclose the processing of metal wire, nor processing of multiple wire pieces in a single channel.

Purcek et al. discloses pure (99.9%) copper deformed by equal-channel angular pressing (ECAP) following route-BC to obtain ultrafine-grained (UFG) microstructures resulting in a refinement of the conventionally grained (CG) initial microstructure of copper down to sub-micron level (See G. Purcek, O. Saray, M. I. Nagimov, A. A. Nazarov, I. M. Safarov, V. N. Danilenko, O. R. Valiakhmetov, R. R. Mulyukov, *Philosophical Magazine*. 2012, 92(6), 690-704). Despite the disclosure of improvement of mechanical properties, Purcek does not disclose ECAP of multiple wire strands in a single pass.

Other works in this field include M. Ebrahimi and F. Djavanroodi in *Progress in Natural Science: Materials International*. 2014, 24(1), 68-74, incorporated herein by reference in entirety and disclosing experimental and numerical analyses of pure copper during ECFE process as a novel severe plastic deformation method. While the work is useful, it is theoretical and does not disclose the processing of multiple copper wire pieces in a single channel.

Preparation of high strength and high ductility Mg-6Zn alloy wire by a combination of ECAP and hot drawing is known (See K. Yan, J. Sun, J. Bai, H. Liu, X. Huang, Z. and Jin, Y. Wu. *Materials Science and Engineering: A*. 2019, 739, 513-8). Cylindrical specimens with a diameter of 15 mm and a height of 80 mm were cut from the extruded bars. Parts of these specimens were processed by six passes of ECAP with an inner angle of 90° and route BC at 200° C. at a pressing speed of 1.5 mm/s. Both the extruded and ECAP samples were machined into straight bars with a diameter of 1 mm. The publication does not disclose multiple wire samples processed in a single channel, assisted by a uniquely suitable support material.

Equal channel angular pressing of copper wire is disclosed (See F. Djavanroodi, M. Sedighi, P. Hashemi, and M. Ebrahimi, *Proceedings of the Institution of Mechanical Engineers, Part B: Journal of Engineering Manufacture*, 2014, 228(10), 1273-9). Djavanroodi discloses improvement of all properties, however, FIG. 2 illustrates a conventional supported ECAP process where a single wire piece is surrounded by a cylindrical mandrel. This setting differs from multiple pieces simultaneously processed in the same die channel.

CN106098246A discloses a method for preparing a high-strength copper flat wire, the combined process including smelting followed by pull-up continuous casting process; a ECAP step and the drawing process. The disclosure does not mention multiple wire strands in the same channel and instead mentions multiple other steps outside of ECAP. A similar process is disclosed in US9468960BB, combining a powder feed with ECAP extrusion of the agglomerated non-ferrous billet (green body).

Other disclosures mentioning ECAP use as a sole method or as a part of a combined processing of copper wires include: V. Spuskanyuk, O. Davydenko, A. Berezina, O. Gangalo, L. Sennikova, M. Tikhonovsky and D. Spiridonov, 2010, *Journal of Materials Processing Technology*, 2010, 210(13), pp. 1709-1715; S. Geißdörfer, A. Rosochowski, L. Olejnik, U. Engel and M. Richert, *International journal of material forming*, 2008, 1(1), 455-8; G. Purcek, O. Saray, M. I. Nagimov, A. A. Nazarov, I. M. Safarov, V. N. Danilenko, O. R, Valiakhmetov, R. R. Mulyukov, *Philosophical Magazine*. 2012, 92(6)690-704; J. T. Wang, Z. Z. Du, F. Kang and Chen G. In *Materials Science Forum* 2006, Vol. 503, pp. 663-668, *Trans Tech Publications*; R. Z. Valiev and T. G. Langdon, *Reviews on Advanced Materials Science*. 2006, 13(1), 15-26; Y. H, Zhao, J. F. Bingert, X. Z. Liao, B. Z. Cui, K. Han, A. V. Sergueeva, A. K. Mukherjee, R. Z. Valiev, T. G. Langdon and Y. T. Zhu, *Advanced Materials*, 2006, 18(22), 2949-53; C. Howard, D. Frazer, A. Lupinacci, S. Parker, R. Z. Valiev, C. Shin, B. W. Choi and P. Hosemann, *Materials Science and Engineering: A*, 2016, 649, 104-13.

US2014000332A in para [0072, 0085] and FIG. 3 discloses a multi-strand version of a die insert used to extrude multiple wires of narrower diameter, however, the extrusion die channel is comprised of several individual sub-channels that each can be loaded by a precursor billet for processing. With the pre-processed billet and a sub-channel at the same diameter, no need for a support exists. This method patentably differs from loading a single channel by multiple annealed billets (rods, bars, slabs, wire) surrounded by a supporting material. Operating multiple independent extrusion sub-channels at the same level of quality may be challenging as well.

The capital, exploitation and amortization costs of ECAP are non-negligible (e.g., including the costs associated with hydraulic press, sensors, cooling system, energy supply, attrition of die channels, attrition and deformation of punches, costs of maintenance, personnel and building rent). While the products obtained by the method are of high quality, the economic considerations may be prohibitive for copper but may still suit more expensive materials such as silver, gold, and platinum. Recalling that the market niche for the latter is narrow, making the method industrially applicable to copper and even cheaper metals is essential. The economy achieved by providing more conductive, durable and lasting industrial items for all spheres of life may exceed ECAP costs. The applicability of these methods is beyond just conductivity improvement alone, but extends to construction elements, connecting and fastening wire or other mechanically crucial elongated parts. The parts of interest of various shapes can be manufactured out of ECAP-optimized billets (rods, bars, slabs, wire) or slabs by known methods, with the proviso that the isotropic and nanoscale microstructure is not perturbed by the machining process.

The unmet need may be technologically satisfied by processing multiple workpieces (ideally—hundreds) in a single ECAP run. Therefore, one objective of the present disclosure is to provide a method of metal wire production that forms wires having, simultaneously, enhanced conductivity and mechanical properties by processing multiple workpieces in a single ECAP channel with a polyurethane support.

BRIEF SUMMARY

According to the first aspect, the invention comprises equal channel angular pressing (ECAP) of multi-size metal wire, wherein a single ECAP die channel houses multiple strands of wire entirely encompassed by thermostable polyurethane support.

According to the second aspect, the angle of the die is 90 degrees and the workpiece is multiply re-processed by ECAP.

According to the third aspect, the re-processing is continued until the crystal structure of the resulting wire consists of a nanocrystal phase with the crystallite sizes of <150 nm.

According to the fourth aspect, the metal is copper and/or copper alloys.

According to the fifth aspect, the metal is chemically pure copper with the purity above 99%, According to the sixth aspect, the metal is any of silver, gold, platinum, titanium, aluminum, steel, palladium, nickel, or the alloys with the predominant content of the above.

According to the seventh aspect, the wires in the ECAP assembly are of unequal diameter and can be of non-circular cross-section.

According to the eighth aspect, the process is implemented by the routes A, BA, BC and C (defined below).

According to the ninth aspect, the ECAP workpiece is slanted to compensate and control the strain.

According to the tenth aspect, the ECAP die channel forms multiple turning angles during a single run, wherein the angles can be equal or unequal.

According to the eleventh aspect, methods of optimization, response surface and designed experiment (Box-Wilson multifactorial composition plans) are applied to identify the critical ranges of parameters.

According to the twelfth aspect, mechanical properties are optimized.

According to the thirteenth aspect, resistivity properties are optimized.

According to the fourteenth aspect, inhomogeneity of the properties along the length dimension of the workpiece is minimized and more generally heterogeneity of the final products is minimized.

According to the fifteenth aspect, ECAP stage is integrated with other methods of metallurgical processing such as annealing, rolling, pulling, extrusion and combinations in any order without limitation.

According to the sixteenth aspect, the thermal regime of the ECAP apparatus is regulated by the rate of compression, the presence of thermally conductive filler in the polyurethane, the length to cross-section aspect ratio, aspect ratio within the cross-section, distance of the working path from the cooling circuit, overall scale of the apparatus.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

DETAILED DESCRIPTION OF THE EMBODIMENTS

The present disclosure will be better understood with reference to the following definitions.

As used herein, the words "a" and "an" and the like carry the meaning of "one or more". Additionally, within the description of this disclosure, where a numerical limit or range is stated, the endpoints are included unless stated otherwise. Also, all values and subranges within a numerical limit or range are specifically included as if explicitly written out.

As used herein, the terms "optional" or "optionally" means that the subsequently described event(s) can or cannot occur or the subsequently described component(s) may or may not be present (e.g. 0 wt %).

As used herein, the term "wire" extends to all metal items with a longitudinal dimension exceeding the diameter by an at least ten-to-one ratio.

As used herein, the term "workpiece" extends to the entire assembly moving through an ECAP channel, which can be exemplified without limiting by a monolithic metal billet, monolithic metal slab, supported tubular piece, one or multiple wires, rods, bars, slabs or the items encompassed by supports.

Figure 1:
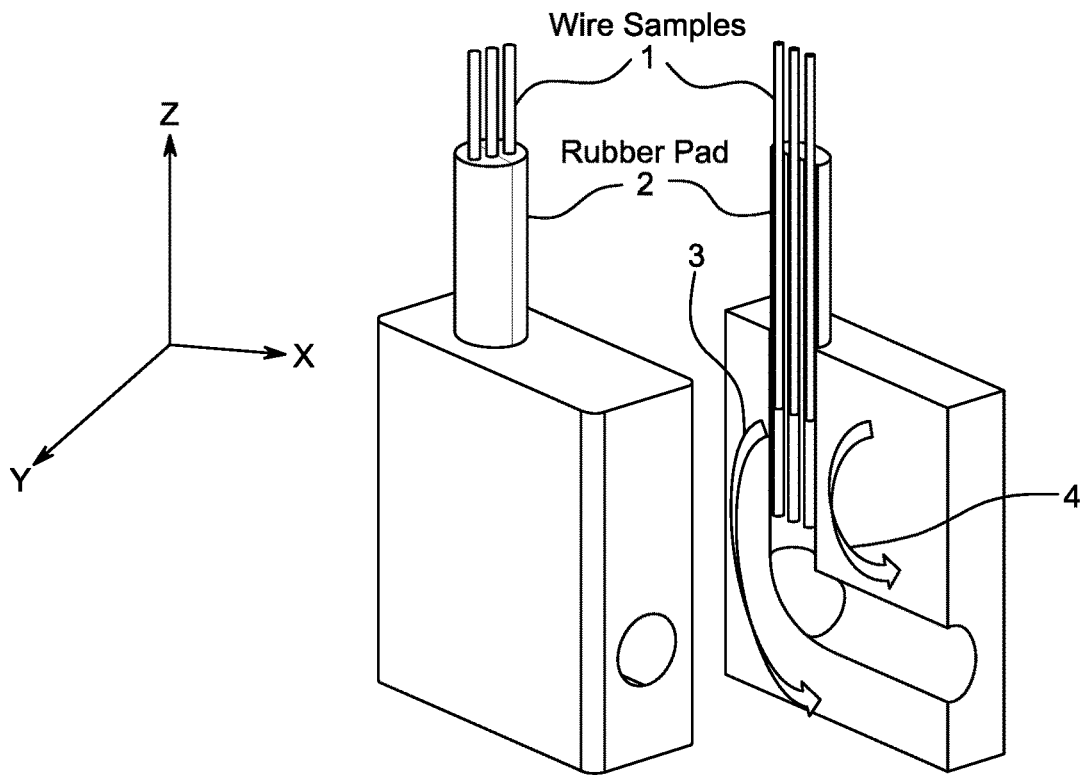
FIG. 1 shows a scheme of equal channel angular pressing of multi-size copper wire.

As used herein, "vertical direction" is the direction normal to the floor plane, shown as the axis Z in FIG. 1.

As used herein, "vertical channel" or "input channel" is the upper ECAP half-channel before the knee/bending/turning angle region.

As used herein, the "horizontal plane" is the plane parallel to the floor plane, shown as the plane X-Y in FIG. 1.

As used herein, the "horizontal channel" or "output channel" is the lower ECAP half-channel past the knee/turning angle region.

As used herein, the term "ECAP channel knee" or "turning angle" is the bending zone of transition between the vertical and horizontal parts of the channel, herein defined above.

As used herein, "finite element" is a voxel of the workpiece volume, with the volume negligible as compared to the entire item.

As used herein, the "outer path" or "outside path" or "longer path" is the length of the path that a finite element of a workpiece travels in the channel starting at the top vertical position up to the exit in the X-Y plane (path 3 in FIG. 1).

As used herein, the "outside angle" is the angle on the outer/outside path of the channel.

As used herein, the "inner path", "inside path" or "shorter path" is the length of the path that a finite element of a workpiece travels in the channel starting at the top vertical position up to the exit in X-Y plane (path 4 in FIG. 1).

As used herein, the "inside angle" is the angle on the inside/inner path of the channel.

As used herein, the term "wrought" extends to the metal workpiece processed into its final shape by mechanical impact.

As used herein, the term "cast" extends to the metal workpiece processing into its final shape by melting and cooling in a form.

As used herein, the term "punch" or "pusher" or "ram" refers to an adaptor conducting the pressure form the head of the hydraulic press to the workpiece in the ECAP channel.

Embodiments of the present disclosure will now be described more fully hereinafter with reference to the accompanying drawings, in which some, but not all of the embodiments of the disclosure are shown.

FIG. 1 shows the overall setting of an embodiment of the inventive ECAP process. The ECAP channel is provided, forming an L-shape or bent configuration with the outer path and the inner path and the corresponding outside and inside angles. The cylindrical channel is filled with the support sheath, exactly matching the inner diameter of the channel by the support's outer diameter. The support is provided with multiple internal sub-channels of an arbitrary shape, encompassing the strands (rods) of the metal for ECAP-processing with matching cross-sections. In operation, the workpiece is pushed starting at the initial position at the top of the vertical side of the die and through the angular/bent section until it emerges completely out of the horizontal side (in the direction of the arrow). During the movement, the metal elements experience a controlled high bending and plastic deformation, with the extent and direction of the deformation controlled by the pressure, process speed as well as the presence of support.

In its various embodiments the invention is not limited to pure copper, copper alloys, or one specific metal, nor limited to conductivity improvement alone. Depending on the final purpose of the metal part, preferred precursors are procured and pre-processed. Methods of production of pure metals and alloys are widely known in the art, as well as methods of machining of billets, slabs and crude wire for ECAP refining. Such methods are incorporated herein by reference in entirety. Chemically pure copper is considered below only as an example without limiting the scope of the disclosure.

The Copper Development Association (CDA) maintains databases of suppliers of chemically pure copper and alloys. ASTM standards define chemical compositions and ranges of ingredients in the alloys and pure metal, geometrical shapes of the delivered material (ingots, slabs, pipes, powder, wire, bulk, plates, rods, foil, bars, strips, extrusions, fittings are described below. The copper products are classified by UNS (Universal Number System) and are searchable based on these numbers. The Copper Development Association references an Architectural Installation Contractors Database that has been prepared for use by architects, engineers, contractors, and consumers as an informative source reference of contractors experienced with architectural copper systems. CDA also references an Architectural Product Manufacturers as a listing of manufacturers who produce sheets, shingles, gutters, decorative and engineered systems. CDA is also referencing CBSA (Copper and Brass Supplier Association). Even in application to pure copper, the materials listed by CDA are broadly classified as "wrought" and "cast".

Table 1 below exemplifies the typical high purity copper products and informs if links to the manufacturers and suppliers are available.

TABLE 1

USN numbers for chemically pure copper metal.

| Alloy UNS# | Designation | Active |
|---|---|---|
| C10100 | Oxygen-Free-Electronic (OFE) | Yes |
| C10200 | Oxygen-Free (OF) | Yes |
| C10300 | Oxygen-Free Copper (OFXLP) | Yes |
| C10400 | Oxygen-Free with Ag (OFS) | Yes |
| C10500 | Oxygen-Free with Ag (OFS) | Yes |
| C10700 | Oxygen-Free with Ag (OFS) | Yes |
| C10800 | | Yes |
| C10900 | Oxygen-Free | No |
| C10910 | | Yes |
| C10920 | | Yes |
| C10930 | | Yes |
| C10940 | | Yes |
| C11000 | Electrolytic Tough Pitch (ETP) | Yes |
| C11010 | Remelted High Conducivity (RHC) | Yes |
| C11020 | Fire-Refined High Conductivity (FRHC) | Yes |
| C11025 | Fire Refined High Conductivity (FRHC) | Yes |
| C11030 | Chemically Refined Tough Pitch (CRTP) | Yes |

Many alloys are registered in the catalogs but not all are described according to the same physical properties and/or chemical properties. Properties typically include Temper, Temper Code, Tensile Strength (ksi), Yield Strength (ksi), Elongation (%), Rockwell B scale, Rockwell F scale, Rockwell 30T scale, Shear strength (ksi), Torsion Modulus (ksi), Melting Point—Liquidus® F., Melting Point—Solidus® F., Density lb/cu in. at 68° F., Specific Gravity, Electrical Conductivity % IACS at 68° F., Thermal Conductivity Btu/sq ft/ft hr/° F. at 68° F., Coefficient of Thermal Expansion 68-212$10^{-6}$ per ° F. (68-212° F.), Coefficient of Thermal Expansion 68-392$10^{-6}$ per ° F. (68-392° F.), Coefficient of Thermal Expansion 68-572$10^{-6}$ per ° F. (68-572° F.), Specific Heat CapacityBtu/lb/° F. at 68° F., Modulus of Elasticity in Tension (ksi), Modulus of Rigidity (ksi). This specific list of properties is provided without limitation and the choice of units is for presentation purposes only, without limiting the scope. Typical industrial applications (bus conductors, power grid, electronics, plates, etc), suitability for methods of processing, forms of delivery (rods, bars, foil, etc.) and associated ASTM are provided for each USN number.

For the number C10100 (Oxygen-free electronic copper, 99.99% purity) and the wire delivery form, the databases identify 8 suppliers: Avins USA Inc., Aviva Metals, Campbridge-Lee Industries Inc., Freeport MacMoRan, Hussey Copper, Millard Wire & Specialty Strip Company, Univertical Corp, Wieland Metals. For the same number C10100, but for the billet delivery form, the list of suppliers is Avins USA, Freeport MacMoRan, ABC Advanced Alloys, Mueller Copper Tube Company, Inc.

Similar associations and cross-referencing are available for other metals, for example, the Aluminum Association, Space Material Database, American Steel Association provide standardized alloy names, properties, technical characteristics, and suppliers. Alternatively and analogously, the list of suppliers can be compiled without limitation based on the standardized alloy names and delivery form, using online and library sources or multiple other methods not included for brevity but known to the skilled in the art (industrial catalogs, company websites, scientific publications, patent review, etc.) and incorporated herein by reference in entirety.

The metal precursor intended for ECAP-processing must be sufficiently ductile to respond to pressure by EPD (Extreme Plastic Deformation, a flow-like microstructure reorganization). If ductility is insufficient and/or the pressure build-up is too fast, the workpiece can crack, fragment and collapse. Large-grain copper is known to be fragile if not metallurgically treated. To improve ductility the metal precursor may be optionally annealed by the methods known in the art, the following non-limiting examples are incorporated herein by reference in entirety (See WO18209805A1, GB190503032A, US2013040454A, JP2000288769A, DE19830485A1, U.S. Pat. No. 6,339,022B, JP2001262294A). The resulting ductility can be assessed by ASTM B272-12(2019) (if the item is a copper wire). Additional standard tests are available at ASTM International for metals. For example, ASTM B846-19a, B820-18 are also the procedures addressing copper formability and ductility. ASTM International provides a searchable database of standards, covering copper wire in its different sizes and compositions.

Bend formability values are expressed by the ratio of the minimum bend radius (MBR) divided by the thickness (t) of the material, MBR/t. Test procedures for measuring bend formability can be found in ASTM E 290 and B 820. A simple test for bend formability in wire is the "Wrap Test." In this test, wire is bent around its own thickness many times. This allows examination of the bend over a long length and for most wire shapes is a MBR/t value of 0.5, a relatively sharp bend. In wire form, most copper alloys will pass this test. In the preferred embodiments, the annealed wire intended for ECAP is annealed at 500° C. until MBR/t<0.5, preferably <0.45, even more preferably <0.4.

Non-limiting examples of other ASTMs useful for characterization of copper wire include: ASTM B3-13(2018) Standard Specification for Soft or Annealed Copper Wire; ASTM B48-00(2016) Standard Specification for Soft Rectangular and Square Bare Copper Wire for Electrical Conductors; ASTM B846-19a Standard Terminology for Copper and Copper Alloys; ASTM B301/B301M-13 Standard Specification for Free-Cutting Copper Rod, Bar, Wire, and Shapes; ASTM B246-15 Standard Specification for Tinned Hard-Drawn and Medium-Hard-Drawn Copper Wire for Electrical Purposes; ASTM B902/B902M-13(2018) Standard Specification for Compressed Round Stranded Copper Conductors, Hard, Medium-Hard, or Soft Using Single Input Wire Construction; ASTM B272-12(2019) Standard Specification for Copper Flat Products with Finished (Rolled or Drawn) Edges (Flat Wire and Strip); ASTM B47-95a(2017) Standard Specification for Copper Trolley Wire; ASTM F68-16 Standard Specification for Oxygen-Free Copper in Wrought Forms for Electron Devices; ASTM B1-13(2018) Standard Specification for Hard-Drawn Copper Wire; ASTM B49-17 Standard Specification for Copper Rod for Electrical Purposes; ASTM B2-13(2018) Standard Specification for Medium-Hard-Drawn Copper Wire; ASTM B286-07(2017) Standard Specification for Copper Conductors for Use in Hookup Wire for Electronic Equipment.

The ECAP supports that may optionally be used include sands (dispersed hard non-compressible particles) or rubber-like elastomers such as rubbers per se or rigid polyurethane elastomers. Each subclass is presented as a non-limiting example only and numerous embodiments are possible within each sub-group to be considered below.

One preferred and non-limiting embodiment are polyurethanes. Typically, polyurethanes are produced by copolymerization of isocyanates and polyols. Polyurethane is a polymer of the repeat unit structure (—R1-NH—C(=O)—O—R2-), where R1 and R2 can be the same or different. The polyurethane polymers may be thermoplastic or thermoset, linear or branched, derivatized or unmodified, saturated or unsaturated, low or high molecular weight. The persons skilled in the art recognize that not all polyurethanes are suitable for the function of supports and mandrels. However, polyurethane rubbers can be successful supports (See F. Djavanroodi, A. A. Zolfaghari, M. Ebrahimi and K. M. Nikbin, *Acta Metallurgica Sinica (English Letters)*. 2013, 26(5), 574-80; F. Al-Mufadi and F. Djavanroodi, *Arabian Journal for Science and Engineering*, 2015, 40(9), 2785-94; F. Djavanroodi, A. A, Zolfaghari, M. Ebrahimi, K. Nikbin, *Acta Metallurgica Sinica (English Letters)*, 2014, 27(1), 95-100), incorporated herein by reference in entirety. The non-limiting preferred embodiments are hard polyurethanes co-polymerized with elastomers. Especially preferred are the polyurethane materials described in F. Djavanroodi, M. Daneshtalab and M. Ebrahimi, Mater. Sci. Eng. A, 2012, 535, 115-121, incorporated herein by reference in entirety.

Hydroxyl-terminated polyester or high molecular weight polyether (600 to 4000 Da) diols or mixtures thereof may be one component of a polyurethane reaction mixture used to form the polyurethane mandrel described herein. Examples of other components that may be used in the polyurethane reaction mixture include polyethers are poly(oxypropylene) diols and poly(oxytetramethylene) diols. Examples of polyesters are adipates, polycaprolactones, and aliphatic polycarbonates. The diols are preferably co-polymerized with a chain extender: this is a low molecular weight (61 to 400 Da) diol such as ethylene glycol, 1,4-butanediol, 1,6-hexanediol or hydroquinone bis (2-hydroxyethyl) and. The extended diols are preferably polymerized with a bulky polyisocyanate mostly a diisocyanate. The most preferred including diphenylmethane-4,4-diisocyanate (MDI). Others are hexamethylene diisocyanate (HDI) or 3,3'-dimethyl-4,4'-biphenyl diisocyante (TODI) (see WO18015173A1, incorporated herein by reference in entirety).

Other non-limiting embodiments of hard polyurethane with elastomeric properties are exemplified by EP1964866 B1, incorporated herein by reference in entirety. The publication discloses a process for producing pore-free thermoplastic polyurethane elastomer moldings having a Shore D hardness in accordance with DIN 53505 of 60 or more, in which polymeric diols and chain extenders are mixed with isocyanate and optionally catalysts, reactive chain extenders, and the other additives to form a reaction mixture. The reaction mixture of EP1964866 B1 may introduced into a mold and cured to form the polyurethane elastomer. In this process, the reactive chain extender is preferably a linear polyether based on propylene oxide (or butanediol), also a diamine having two primary amino groups and a molecular weight in the range from 100 to 500 g/mol. wherein the weight ratio of polymeric diol to chain extender is in the range from 70:30 to 40:60. The polymeric diol of this process is polytetrahydrofuran having a number average molecular weight of from 200 to 2500 g/mol, while the isocyanate is diphenylmethane diisocyanate (diphenylmethane 4,4'-diisocyanate) wherein the emulsifier is an alkoxyethylene glycol ether of the general formula RO(CH$_2$—CH$_2$—O)$_x$H where R is a linear or branched or cyclic alkyl radical having from 5 to 20 carbon atoms and x is an integer from 3 to 15. In a still another embodiment, the publications WO9324549A1, U.S. Pat. No. 5,325,612A, JP4001218A, JP57207037A also disclose hard polyurethane elastomers that may be suitable to form the sheath described herein (each incorporated by reference in its entirety).

In a non-limiting preferred embodiment, the polyurethane is thermoresistant, defined as tolerating the temperatures >200° C. without decomposition. Suitable polyurethane thermoplastic thermostable elastomers can be synthesized via the reaction of NCO-terminated polyurethane with a 2,2'-pyromellitdiimidodisuccinic anhydride chain extender (see H. Y. Mohammad and A. Shamekhi, Polymer, 2004, Volume 45, Issue 2, Pages 359-365, incorporated herein by reference in entirety). In another non-limiting embodiment, a continuous process for producing a thermally stable thermoplastic polyurethane elastomer is incorporated herein by reference in entirety (see U.S. Pat. No. 6,624,278), comprising: A) obtaining a reaction mixture that includes as reactants (i) at least one substantially linear hydroxyl-terminated polyol having a number average molecular weight of 600 to 5000, and (ii) an amount of at least one organic diisocyanate, and (iii) a chain lengthening agent in the form of a diol having a molecular weight of 62 to 500, optionally along with at least one triol, wherein the NCO to OH ratio of all reactants including acid H compounds is in the range of 0.9:1 to 1.2:1, said amount of diisocyanate established to result in the maximum melt viscosity of the reaction product prepared from (i), (ii) and (iii), and B) adding to said reaction mixture at least one acid H compound in an amount of 0.3 to 6 mol. percent, relative to the amount of the chain-lengthening agent, sufficient to result in an elastomer having a constant melt viscosity that is at most 90 percent of said maximum. Other non-liming embodiments of thermoresistant polyurethane elastomers incorporated herein by reference in entirety are in U.S. Pat. Nos. 5,064,875A, 5,093,379A, JP3100051A, JP3100050A, JP3100050A, EP0224945A1, 4,629,768A.

In yet another non-limiting and preferred embodiment, the metal rods, billets or wire intended to be processed by ECAP are already inserted in a pre-set mold. The polyurethane reaction mix fills the spaces between wires or metal precursor under the conditions of room temperature or lower (to prevent a premature reaction). After filling all interstices, the mold is cured at the process temperature regime (200° C.), inducing polymerization. The benefit of this embodiment is to avoid machining of hard polyurethane elastomer for each batch to produce the channels for the accommodation of the ECAP prototypes since molds with the ECAP workpieces of interest can be flexibly pre-set and such process can be automated. In another modification of this embodiment, the metallic elements are placeholders and are removed after curing and cooling, thereby producing the subchannels for the insertion of the real annealed prototype for processing. In yet another and preferred embodiment, the cross-sections of the prototype metal strands in the pre-form can be made to be any arbitrary shape, not necessarily round, for example, and without limitation: triangular, rectangular, oval, undulated, screw-shaped, star-shaped, etc. Thus, a more versatile set of metal parts can be processed as multiple strands of a composite workpiece.

Another preferred embodiment is to incorporate fillers in the polyurethane base and modify the bulk properties of the polyurethane by the presence of fillers. The preferred filler embodiments are inert inorganic thermal conducting particles that behave in a sand-like manner but exceed sand in thermal conductivity and may have served better under the conditions of intense heat evolution that may be rate-limiting in the overall process. Non-limiting examples are graphite, refractory metal chips and powder (metallurgical waste and cuttings), WS2 powder, H13 steel dust cutting, stainless steel powder and cuttings, elemental copper powder and cuttings. While chemical reactivity and contamination of the pure copper surface by non-copper elements is a concern at higher temperatures, the temperature control is immensely facilitated by highly thermo-conductive support, without the risk of the support overheating and overall sub-optimal product quality during the attempts to increase the installation productivity.

Especially preferred embodiments are stainless steel and H13 steel powder cuttings, balancing low price, relative inertness in terms of being a copper contamination and possibility of acid/chelator leaching of the finished wire to remove non-copper penetrants. An even more preferred embodiment is pure copper cuttings, with the proviso that the combination of maximal temperature and pressure does not cause compaction and sintering of the particles in the channel knee. High thermal conductivity of copper particles and non-contamination of the final product indicates superior support in some regimes.

In another preferred embodiment a combination of copper powder waste particles and sand particulates with the average diameter smaller than the copper particles at the mass ratio copper to sand 2:1 is used as a filler for the polyurethane. At this ratio, the smaller sand particulates fill the interstices between the bigger copper particles and inhibit compaction or sintering while thermal conductivity is elevated significantly, while metal-to-metal contacts are minimized. In another preferred embodiment, the copper powder can be added to the polyurethane reaction mix as fillers before curing at 50-70% of the total mass, producing a composition more thermally stable and heat-conductive than pure polyurethane and less prone to compaction than pure copper powder. Sufficient homogenization (in the absence of curing catalyst) ensures that the metal powder and polyurethane reaction batches are intimately mixed and no metal powder aggregates form.

Non-filled polyurethanes may lead to a successful product of good quality without a post-processing stage but limit both the cross-section, pressure, and processing speed in the die due to heat evolution destructive to the quality of the final product. Polyurethanes with pure copper powder filler lack this hindrance but introduce may lead to sintering and/or compaction. A composite copper-polyurethane or copper-sand-polyurethane fillers mixture may be identified to ensure the maximal hourly production by the ECAP pressing at the minimal restoration and post-processing of the final product.

An ECAP installation may include one or more hydraulic presses, channel dies, cooling systems, and sensors. The hydraulic presses suitable for ECAP provide a combination of high pressure, even load distribution in the X-Y plane and a constant (controllable) rate of forward propagation of the workpiece in the die channel.

Theoretical models and force diagrams guiding the required parameters of a hydraulic press are disclosed in N. A. Anjum, M. Shah, S. Mehmood, W. Anwar, S. Anjum, M. S. Khalil, *Technical Journal, University of Engineering and Technology (UET) Taxila, Pakistan,* 2017, Vol. 22, No. 11-2017, incorporated herein by reference in entirety. Hydraulic power systems for ECAP take into account design parameters such as piston stroke, maximum load, cylinder bore, volume flow rate of the working fluid and system pressure. Leading design components hydraulic cylinder, hydraulic circuit and main structure of the system (frame). Pressing load an be calculated for ASTM AISI H13 tool steel that is being used in ECAP die manufacturing. the flow stress of the material is 35 MPa and the surface friction is considered as 0.3, because a very high contact pressure developed between die walls and workpiece. The ECAP die is composed of two channels and these channels are divided into three regimes 1, 2, and 3 for calculating the speed and load (regime 1 is in the vertical part of the die, regime 2 is in the turning region, regime 3 is in the X-Y plane). The analysis allows relating the requirements of extrusion to the tons of hydraulic pressure. In alternative embodiments, the match between the press and the needs of the process can be achieved by empirical calibration, by scaling up the size of the die and observing the increase in the pressure, until it begins to approach the limits for the given hydraulic press. The presses are produced by a wide group of machinery manufacturers such as Press Master, Baileigh Hydraulic Presses, Neff Press, OMERA, Version Hydraulic Presses, Enerpac, Abexmatic Hydraulic, Beckwood Press, Simplex, Phoenix Presses (can be custom manufactured), Wabash Hydraulic Presses (custom manufactured, 100-200 tons), ETK International, Carver Hydraulic Presses, Pacific Experts (custom manufacturing), Magnum Press, Amob Group, Profi Press, Jet Tools, Smith & Associates, Sacmi Iberica, Technopres, Icon Industries and others known to the skilled in the art and incorporated herein by reference in entirety and without limitation.

Figure 2:
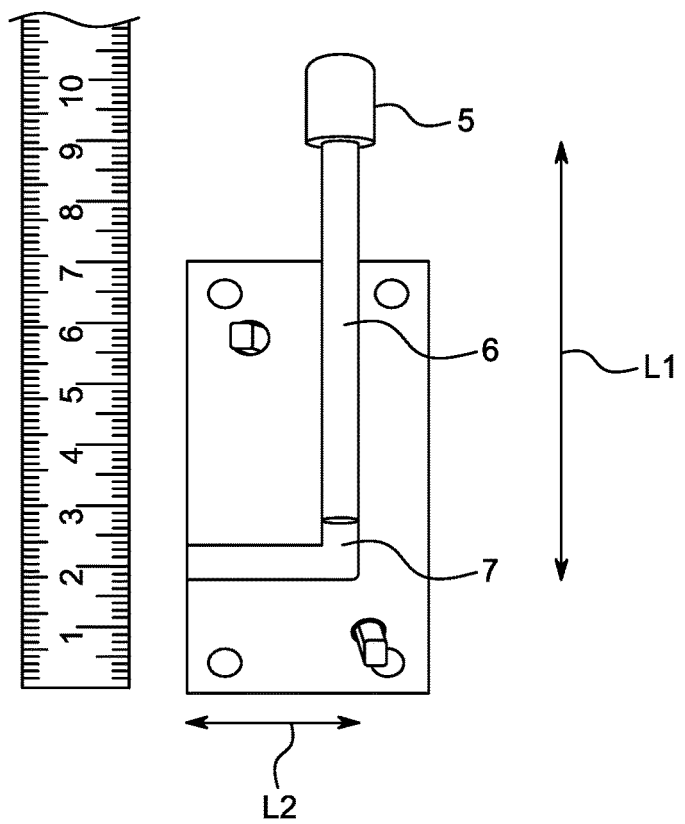
FIG. 2 shows a punch arrangement for an ECAP channel at 90 degrees.

The punch (pusher) is another important component of the ECAP process as the mediator between the force created by the press and the workpiece. It is a hard adaptor shaped to connect the pressing surface and the upper surface of the workpiece assembly, fitting precisely to the latter. Gaps between the punch and workpiece as well as between the channel walls and workpiece are problematic, directing the material—including the supporting sheath—to bulge and flow in the gap, thus leading to wavering, wrinkling and bending of the processed items and inducing a sub-optimal microstructure. FIG. 2 illustrates a typical punch arrangement. The position 5 indicates the head of a hydraulic press and the position 6 indicates the adaptor (punch, pusher) inserted in the head and precisely matching the ECAP channel in diameter, with the vertical side length L1. The position 7 is the horizontal part of the ECAP of the length L2 (importantly L1>L2). In operation, the head of the press propels the adaptor in the ECAP channels which in turn propels the workpiece. Upon reaching the turning part (regime 2), the assembly begins to bend and experience dramatic shearing forces as well as plastic deformation (see below), re-organizing microstructure. When the punch reaches the bottom of the vertical side of the die channel, the workpiece is displaced to the horizontal side of the channel and because L1>L2, a part of the assembly is protruding outside of the apparatus. The protruding side can be used to extract the entire workpiece from the ECAP die by the tools well known to the skilled in the art. The extraction is facilitated by dry lubrication of the walls by tungsten disulfide, forming sliding platelets under the pressure.

In another embodiment, the initial workpiece (#1) is not extracted from the horizontal side of the die channel. Instead, the next workpiece (#2) is loaded in the vertical side and proceeds displacing the workpiece (#1). The advantage of this embodiment is the absence of a separate step of pulling out the finally processed workpiece, making the process uninterrupted under the proviso that cooling is efficient.

The ECAP die is a central element of the technology. Process modeling of equal channel angular pressing for ultrafine grained materials is disclosed (See H. S. Kim, P. Quang, M. H. Seo, S. I. Hong, K. H. Baik, H. R. Lee and D. Minh, *Materials Transactions,* 2004, Vol. 45, No. 7, pp. 2172 to 2176), incorporated herein by reference in entirety. There are two controllable parameters in geometric factors in ECAP; i) die geometry and ii) workpiece geometry. The most widely controlled geometric parameters are the channel angle $\Phi$ and the corner angle $\Psi$ of ECAP dies. Other critical parameters are back-pressure and friction, impacting temperature profile and plasticity of the metal. Additional theoretical treatments linking the geometry of the die to the outcomes (deformation, shape, temperature, residual strain) in the given workpiece are provided below without limiting and are incorporated herein by reference in entirety (See F. Djavanroodi and M. Ebrahimi, *Materials Science and Engineering: A,* 2010, 527(4-5), 1230-5; J. W. Park and J. Y. Suh, *Metallurgical and Materials Transactions A.* 2001, 32(12), 3007; T. Suo, Y. Li, Y. Guo and Y. Liu, *Materials Science and Engineering: A.* 2006, 432(1-2), 269-74; R. Z. Valiev and T. G. Langdon, *Reviews on Advanced Materials Science,* 2006, 13(1), 15-26; F. Djavanroodi and M. Ebrahimi, *Materials Science and Engineering: A,* 2010, 527(29-30), 7593-9; T. Suo, Y. Li, Y. Guo and Y. Liu, *Materials Science and Engineering: A.* 2006, 432(1-2), 269-74).

Despite abundant theoretical treatments, ECAP remains an empirical branch of technology, confined mostly to the research stage due to the complexity of its factor space. The metallurgical properties of the die channel and punch are among the important contributions in this complexity. The die channel material should be hard at elevated temperatures (which can reach 200-700° C., see KR100415346B), not prone to plastic deformations over multiple cycles, and fatigue and crack resistant. This balance of hardness and elasticity is reached in a few alloys, typically used in other metal extrusion die apparatuses. However, the requirements of ECAP are more strenuous, due to multiple runs of the same workpiece through the processing cycle and higher strains (see examples below). Deformations or cracks in the channel and the punch (pressure adaptor) would produce heterogenous sub-standard batches of the products with distorted geometry and inferior microstructure, unlikely to be commercially competitive.

The material suitable for ECAP dies are mostly hard steels (termed "die steels") such as H13 tool steel (See U.S. Pat. No. 9,468,960), chromium12 series cold-forming die steel and M2 high-speed steel (See CN1876880A), PGI Supports Tool & Die Shops provides customized dies made of A2, D2, S7, H13 tool steels. The exact choice of die steel relies on the management of temperature regime during the extrusion process, which in turn depends on the intensity of heat removal and the choice of cooling system (water, oil, air, convective, evaporative without limiting).

The cold-work tool steels include the O series (oil-hardening), the A-series (air-hardening), and the D-series (high carbon-chromium). These are steels used to cut or form materials that are at low temperatures, being the least suitable for ECAP broad range of parameters. The D-series of the cold-work class of tool steels, which originally included types D2, D3, D6, and D7, contains between 10% and 13% chromium (which is unusually high). These steels retain their hardness up to a temperature of 425° C. (797° F.). Common applications for these tool steels include forging dies, die-casting die blocks, and drawing dies, making them more suitable for ECAP, but would require a more rigid temperature control than the hot work die steels.

Hot-working steels are a group of steels used to cut or shape material at high temperatures and are the most suitable for ECAP channel machining. H-group tool steels were developed for strength and hardness during prolonged exposure to elevated temperatures. These tool steels are low carbon and moderate to high alloy that provides good hot hardness and toughness and fair wear resistance due to a substantial amount of carbide. H1 to H19 is based on a chromium content of 5%; H20 to H39 is based on a tungsten content of 9-18% and a chromium content of 3-4%; H40 to H59 is molybdenum based. Other materials useful in servicing the ECAP dies are specialty steels, specifically L-group. Applications for the L-series of tool steels have included precision gauges, bearings, rollers, cold-heading dies, swaging dies, feed fingers, spindles, jigs, shears, punches, and drills. They are also used for machining arbors, cams, chucks, and collets.

The embodiments of this invention are not limited to special steels. Superalloys for turbine and rocket construction retain hardness and fatigue resistance at higher temperatures. International Molybdenum Association presents extrusion presses for extrusion of 3 m long and 250 mm wide brass ingots, which requires 3000-4000 tons of pressure at 1000 C pre-heating. Such parameters are beyond the limits of iron-based materials (melting temperatures in the range 1400-1500 C) and molybdenum MHC alloy (99% of molybdenum) is required for these regimes. The alloy has excellent thermal conductivity, low thermal expansion, both reducing thermal stresses. Importantly, MHC alloy has much greater strength at these temperature ranges of the process and is a preferred embodiment for large scale simultaneous processing of multiple large items by ECAP with fine sand mandrels (0% polyurethane). The use of polyurethanes as supporting sheaths is limited by 150-200° C. range only, with polymers decomposing at the temperatures above, often evolving hazardous products. Superalloy dies are still more reliable than steel dies even at these lower temperatures, leading to the production of consistently standard batches. For multiple simultaneously processed billets, rods or strands the extrusion constants for the entire assembly are high and would require working pressures in the ranges that challenge steel materials, especially in multiple ECAP cycles. Thus, superalloy use for ECAP dies is a preferred embodiment form overall productivity and economy perspective, due to a superior final product quality and turn-around rate of the working cycle.

The temperature control means, associated heat-transfer, and heat-exchange means are important for the process. Rising of temperature above a critical level may melt, decompose, or severely weaken the organic polymer such as rubber or polyurethane. With the elasticity and integrity of the support elements in the ECAP channel turn compromised, final product quality is sacrificed. A composite produced by adding 70% of pure copper powder to 30% of polyurethane reaction mixes as exemplified in the section above provides a possible technical solution to the overheating problem in the support sheaths, allowing increased die volumes, pressures, processing speeds, increased diameters of the wire pre-cursors and shorter time between individual ECAP cycles (below). This intensification of the overall process is essential considering the movement of the ECAP technology to the level of industrial production by overcoming the existing challenges that confine it mostly to the laboratories. Thus, the combination of the methods of the present invention represents a strategic improvement over the methods of prior art.

With the problem of extracting waste process heat from the core of the ECAP channel (a rate-limiting step of the overall heat transfer), absorption and removal of this heat by a cooling jacket built in the die's wall is relatively trivial. A cooling jacket can envelop the die from the outside, with the entire thickness of the die wall serving as a heat-conducting medium. In an alternative embodiment, the cooling pipes may be installed in the die wall, with the overall strength of the construct calculated to accommodate the weakening taking place due to the presence of the internal cooling piping. In this context using expensive superalloys and producing long-lasting although more expensive die installation may be a preferred embodiment. Alternatively, using cheaper thinner dies or flat shaped die cross-sections may be conducive to support externally enveloping cooling jackets.

The departure from the classic circular or quadratic cross-section of the ECAP channel in favor of a billet-shape is another preferred embodiment, increasing the surface-to-volume ratio and changing the dynamics of heat-exchange. The non-limiting examples of aspect ratios are 100:10:5, 100:10:3, 100:10:2 for respectively the length, and the cross-sectional dimensions.

The heat-exchange jacket is operated by pumping coolant through the piping. The coolants are typical and well-known to the skilled in the art, with non-limiting examples of cold water, cooled water-alcohol mix (as low as −40° C.), cold gas flow, evaporative organic solvents. The heat transfer process is not limited by the heat transfer coefficients on the boundary between the coolant and the pipe, or within the pipe wall. Rather, the rate-limiting stages are in the bulk of the die channel wall and/or in the bulk of the support sheath. Thus, the choice of the coolant is less essential than minimization of the heat transfer resistance at the rate-limiting steps as was discussed above.

Figure 3:
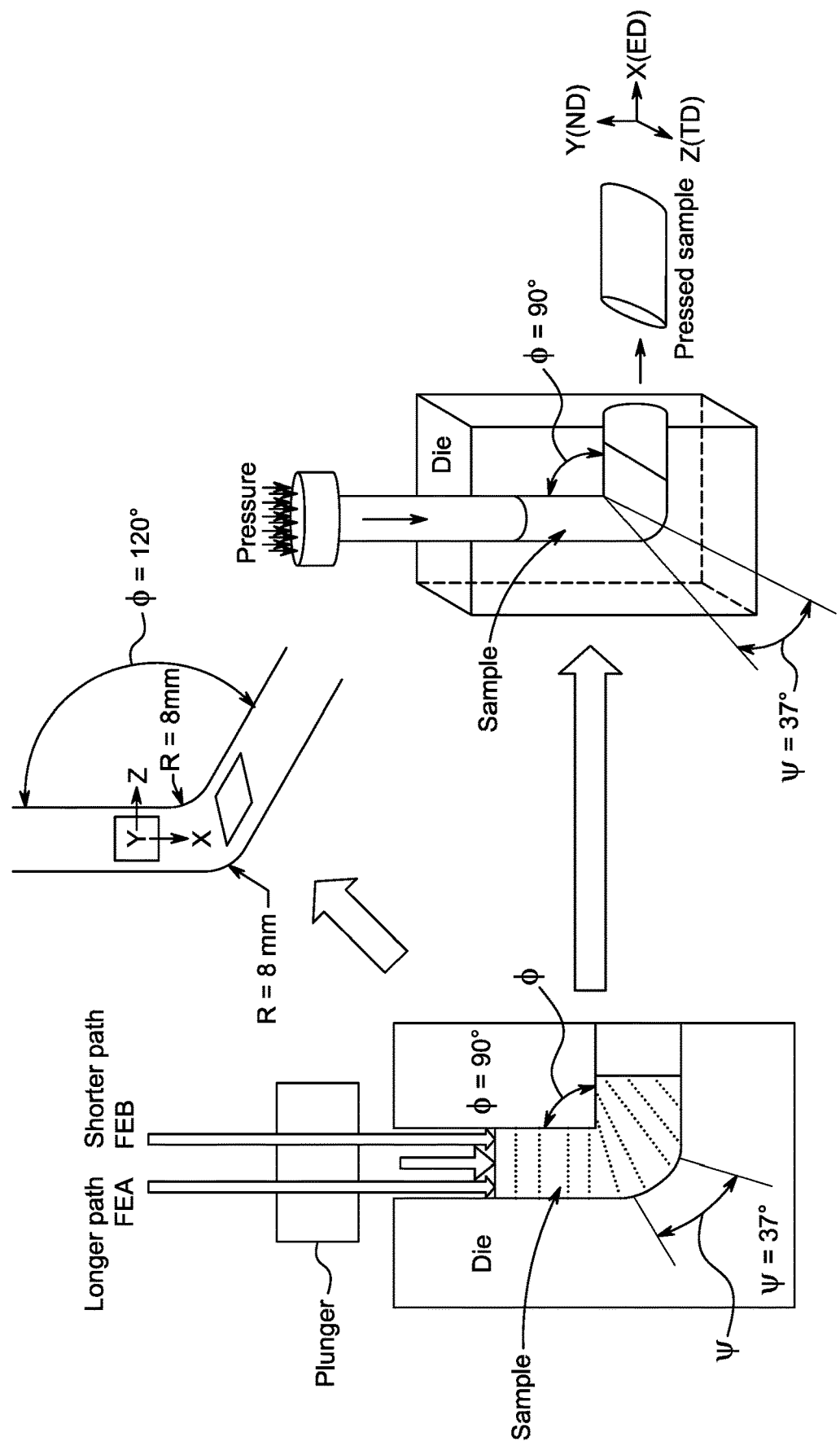
FIG. 3 shows a scheme of deformation evolution in the ECAP channel as a function of the extrusion process.

FIG. 3 indicates that the ECAP path of a finite metal element differs based on its initial position in the apparatus, taking an "outer path" or an "inner path" as shown in FIGS. 1 and 3. The elements are designated as Finite Element A (FEA), moving by an outer path and Finite Element B (FEB), moving by an inner path. Another parameter of importance is the angle of die turning on each of the sides (inner or outer), which can be smoothed or rounded or can be a sharp 90-degree turn. The angles are assumed to be of 90 degrees and equal smoothness on both sides. With equal forces acting on each finite element and equal resistance, the deformation work is proportional to the covered trajectory on both the inner and outer sides. To produce equal covered trajectories, the finite elements being initially in the same X-Y plane at the top of the die channel emerge in different X-Y planes with a slanted connecting cross-section (FIG. 3). Such a deformation incorporates a residual strain in the processed part, the strain being proportional to the cross-section of the wire. While less essential for a single thinner wire, the strain introduces asymmetry in the properties of bigger billets or rods processed by ECAP, as well in the wide workpieces consisting of many wire strands and thus needs to be accounted for.

The presence of the "frozen-in" structural strain increases the free energy of the workpiece and leads to a microstructure re-organization minimizing this increase. In some cases, the strained reorganized microstructure may even be superior in its mechanical and conductive parameters than a completely relaxed annealed prototype control. Thus, the optimal quantity of the residual strain and the pattern of its accumulation (or relaxation) between multiple individual ECAP passes is another critical process parameter.

Figure 4:
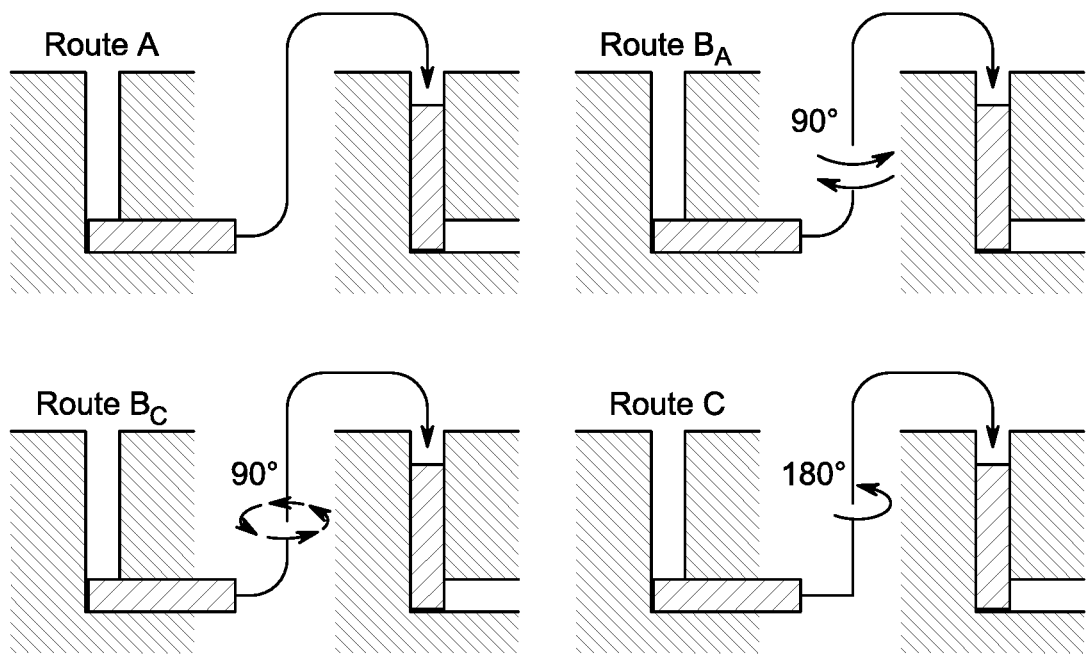
FIG. 4 shows a scheme of workpiece rotation between the individual ECAP passes in a multi-pass process.

In some embodiments, the strain simply accumulates between repeated passes of the workpiece through the die. Such a regime is called "Route A" and is illustrated accordingly in FIG. 4. In this embodiment, the workpiece after extraction from the horizontal channel is re-inserted back into the vertical channel in the same orientation as previously. According to the "Route BA", after extraction from the horizontal channel the workpiece is re-inserted into the vertical channel, and then turned by 90 degrees clockwise between the past and the next run, and then turned by 90 degrees counterclockwise between the next and after-the-next runs. This cycle of clockwise and counterclockwise turns continues between the multiple runs. According to the "Route BC", after extraction from the horizontal channel, the workpiece is re-inserted into the vertical channel with rotation by 90 degrees clockwise. This rotation by 90 degrees continues between the next and after-the-next runs and so on along all intended ECAP runs. According to the "Route C", after extraction from the horizontal channel, the workpiece is re-inserted into the vertical channel with rotation by 180 degrees clockwise, and this pattern continues between all individual runs of the ECAP process (See A. I. Korshunov, I. I. Vedernikova, L. V. Polyakov, T. N. Kravchenko, A. Smolyako and V. P. Solovie, *Reviews on Advanced Materials Science*, 2005, 10(3), pp. 235-238, incorporated herein by reference in entirety).

Figure 5:
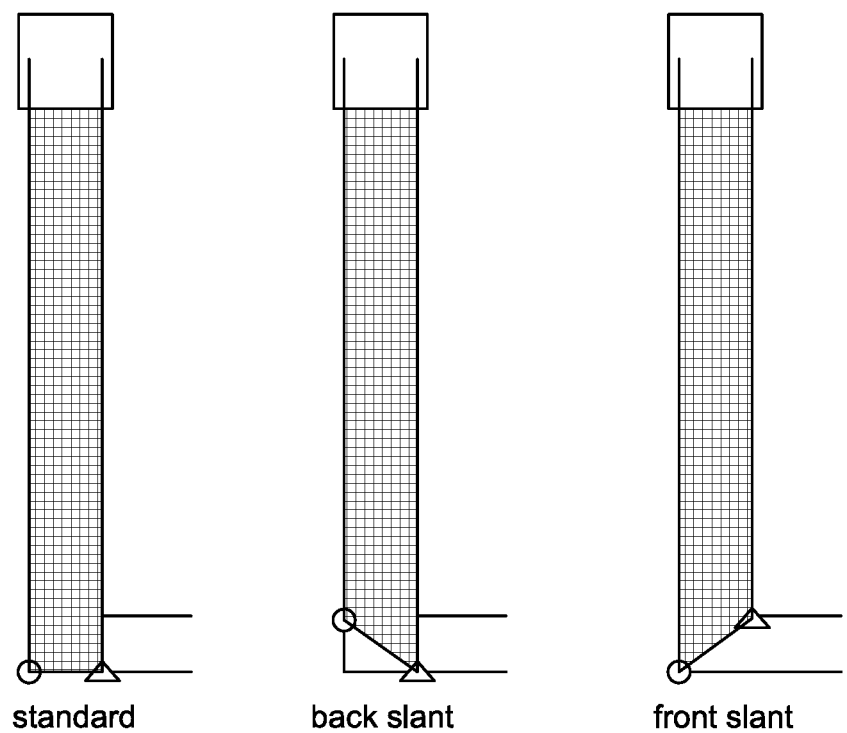
FIG. 5 shows a scheme of alternative slanting of a workpiece.

In some embodiments, the strain is controlled by introducing the initial asymmetry in the workpiece (FIG. 5). The plastic deformation behavior of workpieces having three different preform shapes during ECAP was investigated using experimental and finite element analyses. The results indicated that a preform design slant at the back part of the workpiece head is beneficial to homogeneous deformation, reducing the maximum pressing load at the initial stage and eliminating folding defects at strain concentration points (see S. C. Yoon, M. H. Seo, H. S. Kim, *Scripta Materialia*, 2006, Volume 55, Issue 2, Pages 159-162), incorporated herein by reference in entirety.

Figure 6A:
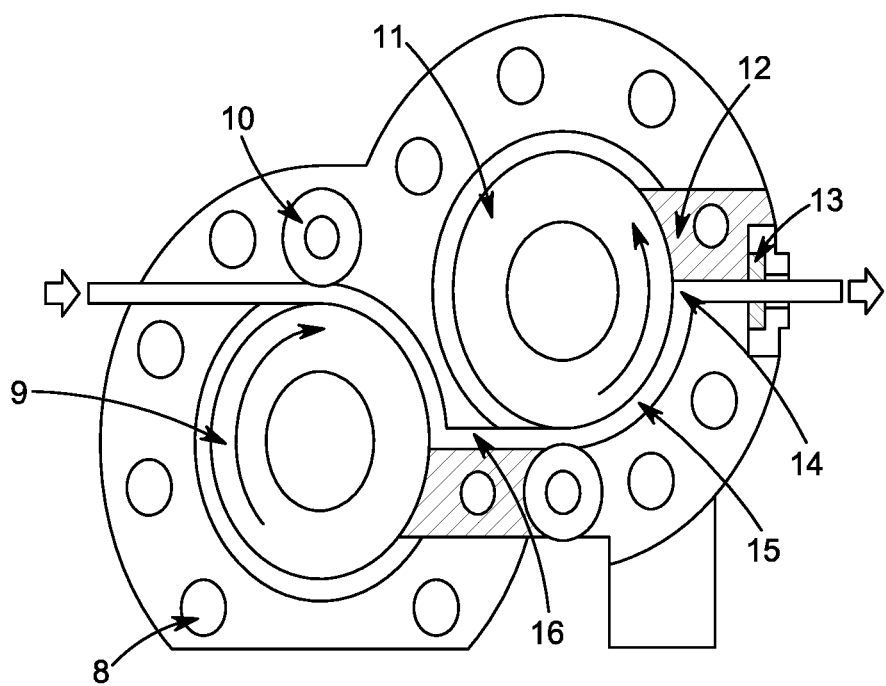
FIGS. 6A-6B show ECAP variations with multiple turning angles.
Figure 6B:
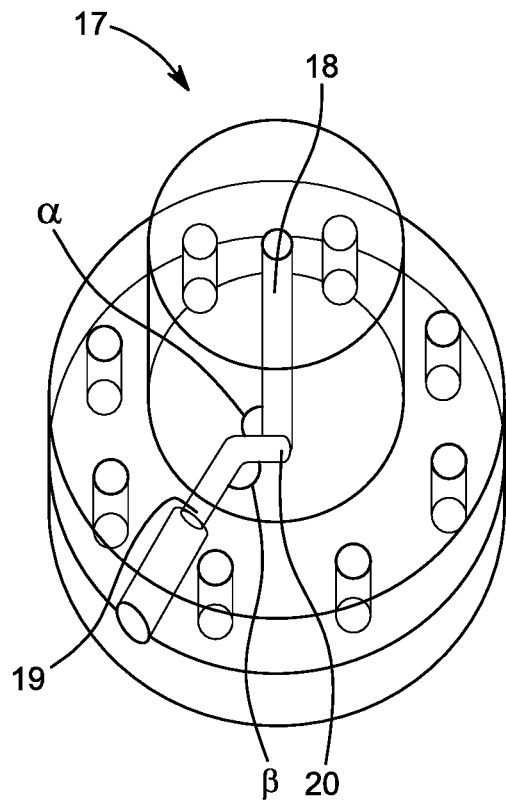

Yet in other embodiments, the strain is controlled by introducing multiple turns and angles in the ECAP die path (FIGS. 6A-6B). Non-limiting examples of these approaches are incorporated herein by reference in entirety. In one embodiment (FIG. 6A) the rolling wheels 9 and 11 participate in strain management while rotating in the opposite directions. Additionally, the turning angles 14 and 16 are oppositely oriented, all together implementing an equivalent of a route C regime during a single ECAP pass (See CN108296297 A). In another embodiment (FIG. 6B) a more passive arrangement is made for 2 turns each at 90 degrees (angles alpha and beta) and in mutually compensating directions in terms of strain generation in channels 18, 19 and 20 (See US2019126333 A). The outcome is also equivalent to route C, achievable during a single process pass.

Figure 7:
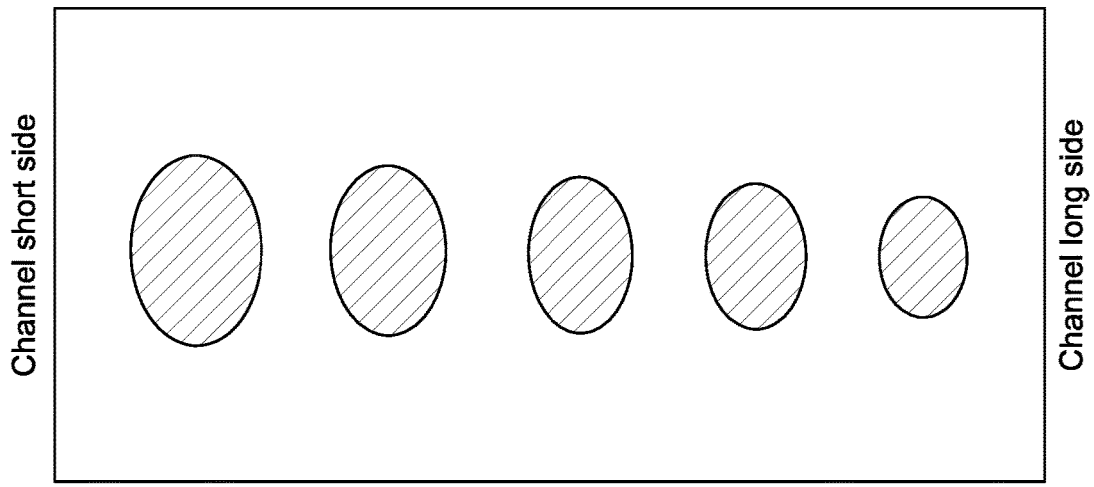
FIG. 7 shows ECAP of multiple-strand wire with variable cross-sections of the workpiece strands.

Yet in still more embodiments, the strain is controlled by asymmetry (different diameters) of multiple workpiece strands in the ECAP die channel (FIG. 7). With the same compressing force applied to each finite volume, the plastic deformation of thinner strands differs from the thicker ones and thus the strain profile can be additionally optimized.

Industrial applicability of ECAP as a method of large-scale production depends on the reproducibility. This reproducibility depends on multiple factors, each capable of introducing a variation. Among these factors are asymmetries in the die in the outer vs. the inner path, the edge effects (head and tail regions of the workpiece differ in the properties from the middle), temperature gradient between the core of the workpiece and the periphery, unequal distribution of pressure in the elements of volume in the die, lengthwise temperature gradient, non-stationary effects. Mechanical properties reach an optimum at a higher number of passes than electric conductivity.

In one non-limiting embodiment, the ECAP apparatus provides improved reproducibility by increasing length to cross-section ratio. The inhomogeneities associated with the edge effects, as well as the gradients of temperature and pressure in the cross-section are minimized when the cross-section to length ratio is minimized. The fraction of the product satisfying the pre-determined quality standards is increased by reducing the share of the edge effects. The preferred cross-section to length ratios are <0.1, preferably <0.05, and even more preferably <0.025 without limitation.

In another non-limiting embodiment, improved reproducibility is provided by changing the turning angle from 90 degrees to a greater value of 110-150 degrees, preferably 120-140 degrees or about 130 degrees without limitation and by introducing multiple oppositely directed turns with these greater angles. These designs are especially suitable for improved conductance. Multiple and oppositely directed greater turning angles may lead to more balanced, lower and gradually introduced strain which favors a reduction of resistivity. Additional strain (lower angles or more passes) restores the original resistivity values for the level observed in the annealed ECAP precursor (see Examples herein below).

In yet another non-limiting embodiment, the process parameters may be identified using multi-factor systems. One non-limiting example of this embodiment is the use of a designed experiment or Box-Wilson experimental planning. Full factorial designed experiment is expensive, but the expenses are justifiable if reproducible quality at industrial scale is the purpose (See R. H. Myers, *Response Surface Methodology,* 1971, Boston: Allyn and Bacon, Inc., G. E. P. Box, and K. B. Wilson, *Journal of the Royal Statistical Society Series,* 1951, B13(1):1-45; R. H. Hardin and N. J. A. Sloane, *Journal of Statistical Planning and Inference,* 1993, vol. 37, pp. 339-369, incorporated herein by reference in entirety).

The factors that can be controlled in the framework of designed multifactorial experiment method are the rate of propagation, pressure, choice of support, the absolute length of the die channel, absolute cross-section of the die channel, outside and inside angles, choice of routes, the shape of the workpiece, aspect ratios. The experimental outputs for chemically pure copper are electric conductivity (>65 MS/m), thermal conductivity (>390 W/m×K), tensile strength (>365 MPa), fatigue resistance (>115 N/mm2 of fatigue strength at >300×10^6 vibration cycles), ductility (MWR/t<0.4, see the ASTM above), surface hardness (>114 HB), corrosion resistance (corrosion rate when exposed to flowing water <0.1 mpy), property homogeneity (inhomogeneity factor IF<0.1 for the entire workpiece).

In still another non-limiting embodiment, the workpieces processed by ECAP undergo post-processing comprising, without limitation: simultaneous or intermediate annealing (1-5 hours at 100-200° C.), post-process or simultaneous extrusion (deformation between 9 and 3×10-2 s-1), hot pulling (T>100° C., with pulling eye attached to copper conductors, the maximum pulling tension should not exceed 0.008 times circular-mil area), simultaneous or post-ECAP rolling (cold or hot, 1-100 atmospheres). The integration of ECAP with other processes can help address inhomogeneities in of the processed workpieces and a high fraction of waste in a single isolated stage. For example, the tail and head portions of the ECAP product may be of inferior quality as compared to the middle section due to edge effects. These discarded portions comprise up to 50% of the total length of the workpiece, are generated at the advanced stage of the technological process, comprise a pure metal that already underwent the annealing step. An economically advantageous embodiment is to direct the primary rejects to the secondary ECAP channel of the same diameter but of a shorter length. The secondary rejects can be directed to a tertiary channel without limitation. The middle parts from the primary, secondary and tertiary ECAP channels in this embodiment are pooled and directed to a downstream process, preferably comprising hot extrusion at the second annealing temperature (the first being the temperature of the original pre-ECAP prototype annealing). The secondary post-ECAP annealing can be a distinct stage, and the annealing can be intermediate between the ECAP passes. Alternatively, and without limitation, the downstream process is hot pulling. Yet alternatively and without limitation, rolling is performed during ECAP pressing or as independent post-processing. Combining the upstream ECAP stage with the downstream methods introducing intense plastic deformation, especially introducing very high length to diameter ratios, the mechanical and electrical properties are homogenized, while the proportion of the rejected material needing recycle to a supplier or in-house rework is minimized. The merging of the upstream and downstream methods can be accomplished by the methods of a multifactor designed experiment.

As shown in Examples 5 and 6 below, the diverse processing history of the metal workpiece is conducive to the synergistic improvement of mechanical properties above the levels reachable by individual components, including ECAP alone. The materials processed by the method combinations are more uniform at the level of microstructure and the heterogeneities expected after pooling the primary, secondary and tertiary ECAP products are decreased. Uniformity is promoted by the introduction of hydrostatic extrusion (HE), rolling or secondary annealing as finishing method, as well as any non-limiting combinations of the above. Even greater effects are observed in more complex processes, where the combinations of extrusion, rolling, pulling and annealing sandwich the ECAP step in the process sequence in any order and not following any theory. Merging multiple methods in an empirically derived integrated approach leads to a more economical, waste-free technology compatible with the increased productivity of multi-strand ECAP of the present invention.

EXAMPLES

Having generally described this disclosure, a further understanding can be obtained by reference to certain specific examples which are provided herein for purposes of illustration only and are not intended to be limiting unless otherwise specified.

Example 1: Equal Channel Angular Pressing of Copper Wire

In Example 1, experiments were conducted using commercial pure (CP) copper in the shape of wire with a diameter of 3 mm and a length of 120 mm. Before pressing, all wire samples were annealed at the 500° C. for 1.5 h and slowly cooled at the furnace to obtain the most homogenized microstructure. A flexible polyurethane rubber with a shore A (HD90) was utilized as a sheath to prevent wrinkling of wire samples during pressing. In detail, all the cylindrical shape rubber pads have been drilled along the central longitudinal axis. For this study, an ECAP die with the die channel angle of 90°, the outer corner angle of 15° and a channel diameter of 19.1 mm was designed and manufactured. Although the frictional effect during this operation is not important as compared to the conventional ECAP process, molybdenum disulfide (MoS2) was applied as a lubricant to decrease frictional effects between rubber with both die and wire. All ECAP operations were accomplished at the ambient temperature via a hydraulic press with a punch speed of about 2 mm s2. FIG. 1 shows hydraulic press, ECAP die setup, CP copper sample and rubber pad before an operation.

Example 2: Characterisation of Hardness

To investigate hardness characteristics consisting of average hardness magnitude and hardness distribution uniformity, head and tail sections of samples have been removed. During ECAP, head and tail sections are subjected to low shear stress, resulting in low effective strain magnitude with nonuniformity strain distribution. Also, the inhomogeneity factor (IF) has been utilized to explore the distribution of hardness uniformity (See V. P. Basavaraj, U. Chakkingal, and T. S. P. Kumar. 2009, *J Mater Process Tech*, 209: 89-95, incorporated herein by reference in entirety).

$$IF = \frac{\sqrt{\frac{1}{(n-1)}\sum_{i=1}^{n}(HVi - HVave)2}}{HVave} \quad (1)$$

where HVi is Vickers hardness value at each point, HVave is the average magnitude of Vickers hardness measurements and n is the number of data.

Figure 8:
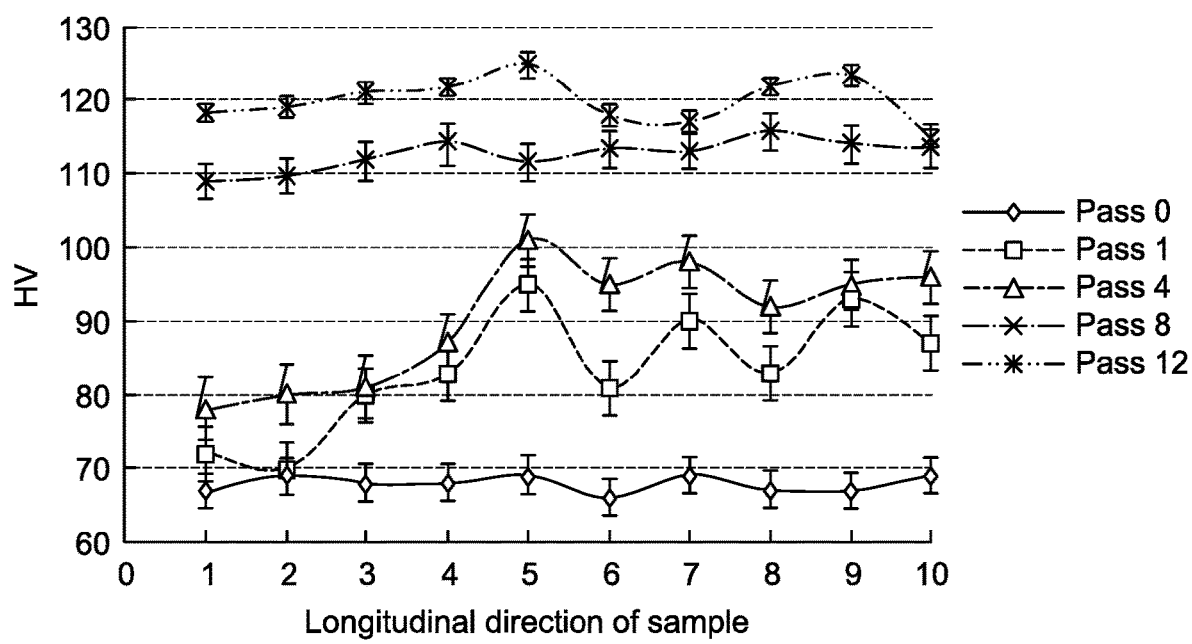
FIG. 8 shows Magnitudes of average Vickers hardness (HV) for various pass numbers of ECAP process along the longitudinal direction of a specimen.

Lower value for IF indicates better hardness distribution homogeneity for wire samples. By considering that equation (1) takes all measured hardness values of the sample into account, it is believed that the IF parameter is more convenient and reliable for examining the level of hardness distribution homogeneity within the wire. After removing the head and tail parts, the sample is halved using a wire cut machine and then half of the sample is mounted for HV records. HV tests are conducted along the axis of the specimen. To minimize errors, two records, at each point and the average magnitude of the reading, have been reported. A total number of 20 HV tests have been performed for each sample. FIG. 8 demonstrates the about two-fold increase of Vicker's hardness in the ECAP processed samples as compared to the run "0" (the pre-ECAP annealed copper wire). The increase is proportional to the number of ECAP passes, but the proportionality is complex, with hardness reaching a maximum at 8 passes, and beginning to decrease at 12 passes. The longitudinal distribution of the property is improved at a higher number of passes.

Example 3: Characterization of Electric Conductivity

Figure 9:
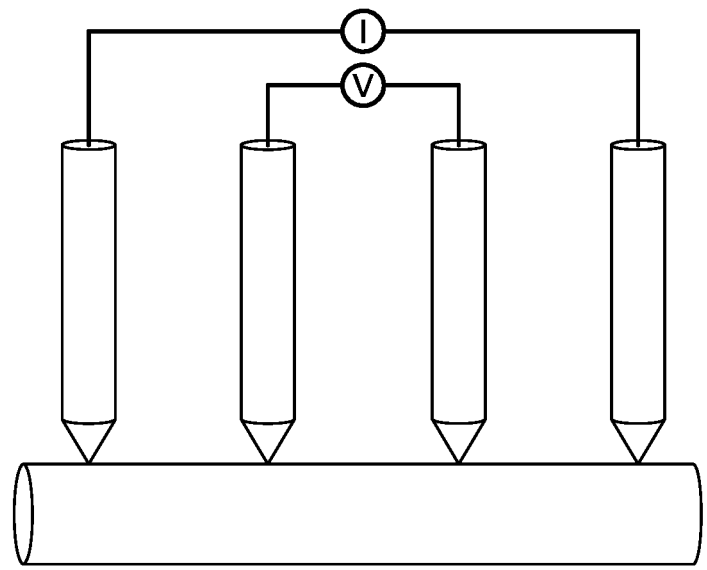
FIG. 9 shows a schematic representation of the four-point probe apparatus.
Figure 10:
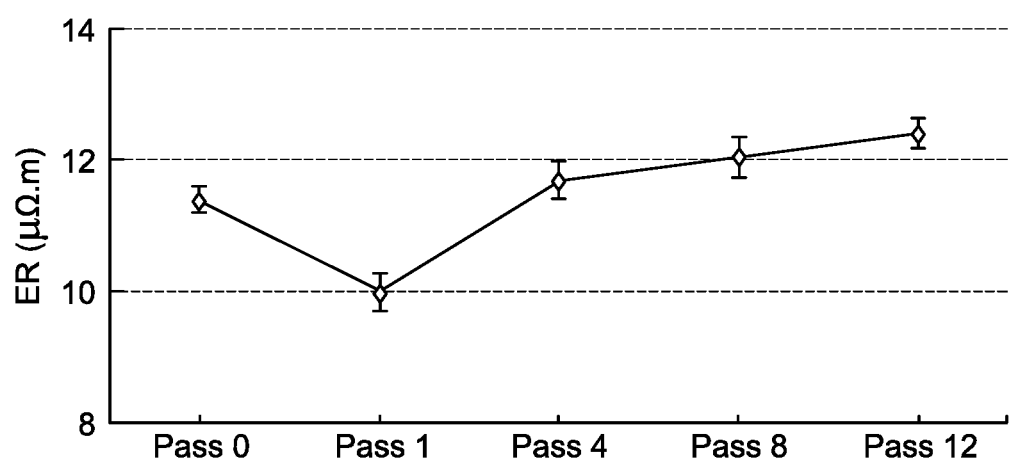
FIG. 10 shows the average electrical resistivity (ER) magnitudes for various pass numbers of ECAP process

By considering that most applications of pure copper wires are in the electrical industry, investigation of ECAPed samples' conductivity is unavoidable. Fourpoint probe method is used to measure electrical resistivity (See S. A. Hosseini, H. D. Manesh, 2009, *Mater Design*, 30: 2911-2918; A. Habibi, M. Ketabchi and M. Eskandarzadeh, 2011, *J Mater Process Tech*, 211, 1085-1090, incorporated herein by reference in entirety). In this method, four sharp probes are mechanically forced on the surface of a workpiece in which current is passed through the outer probes and induces a voltage in the inner ones. A schematic representation of the four-point probe method is shown in FIG. 9. A constant direct current (DC) is passed through the outer current probes, and then the voltage drop across the two inner voltage probes is recorded with a digital voltmeter. Based on these measurements and theoretical relationships, the device reports the electrical resistance of samples. The results are presented in FIG. 10 show a significant decrease of resistivity after 1 pass, but resistivity gain in subsequent passes. Each datum is obtained by averaging three tests for avoiding errors. As can be observed, the specimen resistivity decreases by increasing pass numbers at the low magnitudes of plastic strain. At the medium values of plastic strain, that is, up to the fourth pass of pressing, the resistivity of sample returns to the annealed state level. Further pressings lead to increase in electrical resistivity resulting in a reduction of wire conductivity. It can be said that resistivity magnitude during ECAP process of copper wire results in decreasing of 12.5% after the first pass and then increasing of 2.6%, 5.6% and 8.8% after 4th, 8th and 12th passes, respectively. The reason for electrical resistivity diminution during the first pass is related to the elimination of point defects because of the low-temperature dynamic recovery phenomenon.

Example 4: Reproducibility of the Results

The alternative embodiments of the method were studied to assess lab-to-lab reproducibility of mechanical and conductivity changes induced by ECAP vs. the Embodiment 1 produced in the inventor's lab. In Embodiment 2, Pure Cu (99.99%) is processed by equal-channel angular pressing (ECAP) and by high-pressure torsion (HPT). The electrical resistivity as well as the microhardness increases with an increase in the equivalent strain at an early stage of straining but saturates to a steady state at the equivalent strains more than 20. At the steady-state, the samples processed by ECAP and HPT show a significant increase in the hardness (270%) but a little decrease in the electrical conductivity (12%) when compared to the annealed state. Transmission electron microscopy confirms that the microstructure does not change at the saturated level with further straining. Evolutions of hardness, electrical conductivity and microstructures are also investigated after post-HPT annealing (See K. Edalati, K. Imamura, T. Kiss, Z. Horita, *Materials transactions*. 2012, 53(1):123-7, incorporated herein by reference in entirety).

In example 3, the wear properties and electroconductivity of three ultra-fine grained (UFG) commercially pure copper materials, subjected to combinations of high-pressure torsion (HPT) and equal channel angular pressing (ECAP), were studied and compared with conventional coarse-grained (CG) copper. The results are discussed as a function of microstructure and microtexture. The UFG specimens demonstrate no significant decrease in electroconductivity by comparison with CG copper. The conductivity of an ECAP+HPT specimen showed a value of 99.3% of annealed copper and the same sample showed the lowest wear rate among the UFG specimens. However, all UFG specimens gave higher wear rates than CG copper and there was no evidence for the enhanced wear resistance reported for nanocrystalline copper obtained by surface mechanical attrition treatment (SMAT) and electrodeposition. This result is explained by competing processes: shear by sliding and normal compression by impact load. (see A. P. Zhilyaev, I. Shakhova, A. Belyakov, R. Kaibyshev, T. G. Langdon, *Wear.* 2013, 305(1-2):89-99, incorporated herein by reference in entirety).

In Example 4, The effect of severe plastic deformation on the structure, strength, and electric conductivity of a Cu—Cr copper-based alloy were studied. In ultrafine-grained specimens produced by severe plastic deformation by torsion and equal-channel angular pressing, the average grain size has been determined and particles of precipitates have been identified. The dependences of the strength and electric conductivity on conditions of severe plastic deformation and subsequent heat treatment have been assessed. The effect of dynamic aging in the Cu—Cr alloy has been found that leads to an increase in both the strength and the electric conductivity. It has been found that the ultrafine-grained alloy can demonstrate a combination of high ultimate strength (790-845 MPa) and an increased electric conductivity (81-85% IACS) (See R. K. Islamgaliev, K. M. Nesterov, R. Z. Valiev, *The Physics of Metals and Metallography,* 2015, Volume 116, Issue 2, pp 209-218, incorporated herein by reference in entirety).

Comparison of the Example 1 with the Examples 2-4 points to a greater reduction of resistivity under the inventive conditions of experimentation accompanied by significant improvement of mechanical properties comparable to the improvements in the alternative conditions. Example 1 demonstrated conductance improvement in pure annealed copper, which is already highly conductive and therefore any further improvement is more challenging in comparison with less ordered metal structures (less conductive metals, alloys). Example 4 is a chromium alloy and improvement of conductivity in such a system is relatively trivial, while in Embodiment 1 deep (25%) reduction of resistance in pure copper is surprising.

Example 5: Further Improvement of Mechanical Properties for the ECAP-Ed Samples Undergoing Integrated Treatment by Hydrostatic Extrusion In non-limiting Example 5, nickel and/or copper are subjected to a combination of methods. The purity of nickel used in the experiments was 99.98%, and that of copper—99.8%. The SPD (Severe Plastic Deformation) parameters employed are given in Table 2. The ECAP process was conducted in a 90-degree die by route BC in eight passes for nickel and sixteen passes for copper. The hydrostatic extrusion (HE) process was carried out until the final diameter was reduced to 3 mm, with the total length of the product of about 350 mm. Both materials after HE have been water quenched to reduce recovery. Both processes were conducted at room temperature. The deformation rates for HE varied between 9 and $3\times10^{-2}$ s$^{-1}$, whereas in the ECAP process $8\times10^{-2}$ s$^{-1}$. The starting microstructures were analyzed using optical microscopy and, after the SPD by transmission, electron microscopy at the accelerating voltage of 120 kV. A quantitative analysis of the images obtained (grain size distributions) were performed using the "Micrometer" software. The mechanical properties were determined by tensile tests conducted at room temperature at a strain rate of $2\times10^{-3}$ s$^{-1}$. HV0.2 (15 s) of the materials subject to combined SPD treatment was also measured.

TABLE 2

The deformation path layout, where ECAP is equal channel angular pressing, HE - hydrostatic extrusion, ECAP + HE indicates that ECAP is upstream and is followed by extrusion, HE + ECAP + HE indicates that ECAP step is sandwiched between the upstream and downstream extrusion steps in an integrated process.

| Type of SPD | Cu true strain | Ni true strain |
| --- | --- | --- |
| ECAP | 18.4 (16 passes) | 9.2 (8 passes) |
| HE | 5.65 | 4.6 |
| ECAP + HE | 22.3 | 12.4 |
| HE + ECAP + HE | — | 13.5 |

In both materials, ECAP and HE applied separately resulted in non-homogeneous structures. (See F. H. Dalla Torre, E. V. Pereloma, C. H. Davies, *Acta Materialia.* 2006, 54(4), 1135-46) Hence the idea was developed to combine the HE and ECAP to increase deformation degree, and after the deformation path to bring about activation of additional slip systems.

TABLE 3

Grain size copper and nickel after various deformation paths

| Type of SPD | Cu | Ni |
| --- | --- | --- |
| Initial prototype | 250 micrometers | 50 micrometers |
| ECAP | 250 nanometers | 400 nanometers |
| HE | 250 nanometers | 350 nanometers |
| ECAP + HE | 120 nanometers | 160 nanometers |
| HE + ECAP + HE | — | 100 nanometers |

With copper, the hydrostatic extrusion was preceded by an ECAP process, with the true strain of 22.3, whereas in nickel, the combined process included the HE+ECAP+HE sequence with a total strain of 13.5. The experiment with a double change of the deformation technique aimed at examining how the changes in the deformation path affect the properties of the material. In copper, the combined ECAP+HE process resulted in an abrupt refinement of the microstructure down to a grain size of 120 nm. The refinement was accompanied by microstructure homogenization. The diffraction images suggest that grains are predominantly surrounded by high-angle boundaries, which was also confirmed by darkfield observations. By changing the deformation path twice and applying a strain of 13.5, nickel was obtained with an average grain size of 100 nm.

The results of the mechanical test for nano-copper and nickel are shown in Tables 4 and 5, respectively. In both materials, the mechanical strength increases with increasing deformation. The strength is higher in the material subject to HE than in the material after ECAP, although HE accumulated strain is almost three times lower. This can be attributed to the different straining rates which in HE are much higher than in ECAP.

TABLE 4

Mechanical properties of copper at the initial state and after various deformation paths. UTS - ultimate tensile stress, YS - yield stress, ε - elongation.

| Type of SPD | True strain | UTS [MPs] | YS [Mpa] | ε (%) |
| --- | --- | --- | --- | --- |
| Initial prototype | 0 | 290 | 280 | 16 |
| HE | 5.56 | 446 | 460 | 12 |
| ECAP | 16 | 395 | 390 | 10 |
| ECAP + HE | 23 | 555 | 530 | 9 |

TABLE 5

Mechanical properties of nickel at the initial state and after various deformation paths. UTS - ultimate tensile stress, YS - yield stress, ε - elongation.

| Type of SPD | True strain | UTS [MPs] | YS [Mpa] | ε (%) |
| --- | --- | --- | --- | --- |
| Initial prototype | 0 | 320 | 270 | 18 |
| HE | 4.6 | 946 | 926 | 15 |
| ECAP | 8 | 780 | 630 | 20 |
| ECAP + HE | 11.2 | 1200 | 1120 | 9.5 |
| HE + ECAP + HE | 12.3 | 1255 | 1180 | 11 |

These two processes, HE and ECAP, also differ in the strain components. ECAP is dominated by pure shear, whereas HE—by three-dimensional compressive strain state. The combined HE and ECAP process gives an abrupt increase in the material strength. In copper, the yield strength in comparison to the initial one increases by 90%, whereas in nickel, when treated by a HE+ECAP+HE process—by 340%. This is due to the lower propensity of nickel to dynamic recovery. In both materials, despite the abrupt increase of strength, relatively high plasticity of about 10% remains. HE and ECAP processes applied separately to nickel and copper brought about an abrupt increase of the strength properties of these materials. However, their structures were non-uniform, with deformations and sub-dislocation structure. Double and triple combinations of two techniques (ECAP, HE) lead to an increase of the deformation degrees and changes of the deformation paths, yielding copper and nickel with homogeneous microstructures with equiaxial grains. In both materials, the 100 nm grain refinement was obtained. This strong refinement resulted in a great improvement of the strength to the level of high-strength commercial alloys. In nickel, the best mechanical properties were obtained by using a combined HE+ECAP+HE treatment under a total true strain of 13.5 (yield stress YS=1180 MPa), whereas, in copper subjected to a combined ECAP+HE treatment at a true strain of 22.3, the yield stress was 530 MPa. Both materials preserved useful plasticity (Ni—11%, Cu—9%) unachievable by conventional techniques of strain hardening. The present experiments enabled developing technology for the production of nanocrystalline Ni and Cu with properties superior to those obtained by traditional SPD techniques, such as ECAP or HPT.

Examples 6-8: Further Improvement of Mechanical Properties for the ECAP-Ed Samples Undergoing Integrated Treatment by Post-ECAP Annealing and Intermediate Annealing In non-limiting Example 6, the effects of intermediate heat treatment on the nanostructure and the mechanical properties of pure copper samples processed by four passes of equal channel angular pressing (ECAP) and cold rolling (CR) with a total reduction of 55 pct were investigated. The annealing treatments were done at 423 K, 463 K, and 523 K (150° C., 190° C. and 250° C.) for 15 minutes. Microstructural examinations revealed no trace of a recrystallization after annealing at 423 K (150° C.). X-ray diffraction analysis illustrated that employing annealing treatment at 463 K (190° C.) decreased the coherent domain size and, consequently, increased the micro-strain value. Moreover, nucleation of the newly formed grains resulted from discontinuous static recrystallization decreased the mean grain size. The yield and the tensile strength were also enhanced due to the reduction of the coherent domain size, the internal stress augmentation, and the presence of the new fine grains. Annealing at 523 K (250° C.) increased the fraction of the recrystallized structure and, consequently, decreased the fraction of the grains created by ECAP.

In non-limiting Example 7, the influence of proper intermediate heat treatment on mechanical properties of the ultrafine-grained copper processed by ECAP was investigated. The tensile experiment showed that the ultimate strength is elevated about 50 MPa compared with the sample without intermediate annealing. X-ray diffraction peak broadening analyses have demonstrated that the coherent domain size decreased in some ways with the intermediate annealing, which is the reason for the increase in strength of the copper specimen.

In non-limiting Example 8, the pure copper sample was severely plastically deformed by an 8-pass equal channel angular rolling process. The thermal stability of processed copper was investigated by measuring the development of microhardness at isochronal annealing temperature. According to variation in microhardness, the recrystallization temperature of pure copper after 8 passes of equal channel angular rolling process was 230° C. The influence of post-annealing on microstructure, mechanical and electrical properties of the 8-pass processed copper were investigated. Scanning electron microscopy micrographs and X-ray diffraction peak broadening analysis have demonstrated that grain size decreased with post-annealing, which is the reason for the increase in strength (>15%) of the copper specimen. The electrical conductivity of the sample increased after post-annealing because of the rearrangement of dislocations.

The temperature range wherein the annealing steps lead to further improvements of conductance (150-180° C.) is compatible with the stability of thermo-resistant polyurethane and therefore the inventive multistrand workpieces are suitable for sophisticated secondary annealing regimes in the same ECAP apparatus.

The invention claimed is:

1. A process to fabricate a plurality of ultra-fine grain metal wires, comprising:
   annealing a plurality of metal strands having a thickness (t) at a temperature of 500° C. or greater to form a plurality of annealed strands having a minimum bend radius/(t) according to ASTM E 290-14 of <0.4;
   curing a polyurethane reaction mixture around the plurality of annealed strands to form a sheathed strand assembly;
   equal channel angular pressing (ECAP pressing) the sheathed strand assembly through an ECAP die having a die channel having an angle of turning of 90 degrees, to form a plurality of ECAPed strands;
   hydrostatically extruding the plurality of ECAPed strands to form a plurality of reduced diameter strands; and
   quenching the plurality of reduced diameter strands in water to form the plurality of ultra-fine grain metal wires, wherein the plurality of ultra-fine grain metal wires have a grain size of 120 nm or less.

2. The process of claim 1, wherein the metal strands are copper or copper alloys.

3. The process of claim 1, wherein the metal strands are elementally pure copper at >99.99% of Cu element in the metal.

4. The process of claim 1, wherein the ECAPing is carried out more than once.

5. The process of claim 1, wherein at least one of the metal strands has a diameter different from one or more of the metal strands.

6. The process of claim 1, further comprising:
   preparing the sheathed strand assembly by inserting the annealed strands in the polyurethane reaction mixture prior to the curing.

7. The process of claim 6, wherein the polyurethane reaction mixture comprises copper fragment, copper chip, copper cuttings or copper powder filler in an amount of 30% to 60% percent by weight of the total weight of the polyurethane reaction mixture.

8. The process of claim 1, further comprising:
   ECAP pressing the ECAPed strands on a backward-slanted sheathed strand assembly.

9. The process of claim 1, wherein the tensile strength of the water quenched strands is at least 70% greater than the tensile strength of the annealed strands.

10. The process of claim 6, wherein the metal strands in the sheathed strand assembly are non-circular.

* * * * *